(12) United States Patent
Kabir et al.

(10) Patent No.: US 12,014,996 B2
(45) Date of Patent: Jun. 18, 2024

(54) MOISTURE HERMETIC GUARD RING FOR SEMICONDUCTOR ON INSULATOR DEVICES

(71) Applicant: Intel Corporation, Santa Clara, CA (US)

(72) Inventors: Mohammad Kabir, Portland, OR (US); Conor P. Puls, Portland, OR (US); Babita Dhayal, Aloha, OR (US); Han Li, Hillsboro, OR (US); Keith E. Zawadzki, Portland, OR (US); Hannes Greve, Portland, OR (US); Avyaya Jayanthinarasimham, Hillsboro, OR (US); Mukund Bapna, Hillsboro, OR (US); Doug B. Ingerly, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 16/914,045

(22) Filed: Jun. 26, 2020

(65) Prior Publication Data
US 2021/0407932 A1   Dec. 30, 2021

(51) Int. Cl.
| | | |
|---|---|---|
| H01L 23/00 | (2006.01) | |
| H01L 21/762 | (2006.01) | |
| H01L 23/58 | (2006.01) | |
| H01L 27/12 | (2006.01) | |

(52) U.S. Cl.
CPC ...... *H01L 23/564* (2013.01); *H01L 21/76251* (2013.01); *H01L 23/562* (2013.01); *H01L 23/585* (2013.01); *H01L 27/1203* (2013.01)

(58) Field of Classification Search
CPC ............ H01L 23/564; H01L 21/76251; H01L 23/562; H01L 23/585; H01L 27/1203; H01L 23/58; H01L 2924/14
USPC .......................................... 257/506; 438/207
See application file for complete search history.

(56) References Cited

U.S. PATENT DOCUMENTS

2009/0140391 A1\*   1/2009   Hou et al. ............. H01L 23/564
                                                                257/620

\* cited by examiner

*Primary Examiner* — Thinh T Nguyen
(74) *Attorney, Agent, or Firm* — Essential Patents Group, LLP

(57) ABSTRACT

Moisture hermetic guard ring structures for semiconductor devices, related systems, and methods of fabrication are disclosed. Such devices systems, and methods include a guard ring structure laterally surrounding semiconductor devices of a device layer and metal interconnects of an interconnect layer, the guard ring structure extending through the interconnect layer, the device layer, and a bonding layer adjacent one of the interconnect layer or the device layer the bonding layer, and contacting a support substrate coupled to the bonding layer. Such devices systems, and methods may further include via structures having the same material system as the guard ring structure and also extending through the interconnect, the device, and bonding layers and contacting a support substrate.

12 Claims, 10 Drawing Sheets

MOISTURE HERMETIC GUARD RING FOR SEMICONDUCTOR ON INSULATOR DEVICES

BACKGROUND

In semiconductor (or silicon) on insulator (SOI) technology, an insulator-semiconductor wafer is attached to a device wafer, for example, through silicon dioxide bonding. Such technologies offer advantages such as the ability to grind a large portion of the device wafer leaving only a thin device wafer and thereby reducing leakage (due to the inability to control doping into the thickness of the device wafer) during eventual operation as well as providing other advantages.

However, such bonding of the device wafer to the insulator-semiconductor wafer is relatively weak and exposes the bonding layer (e.g., silicon oxide to the environment). Such exposure causes the bond to become yet weaker as moisture is absorbed. During use, as a device goes through moisture exposure as well as temperature cycling, large fatigue stresses are applied to the bonding layer. In some cases, the bonding layer can be opened (e.g., beginning at an edge of the die) causing thermal and mechanical integrity loss, reduced device performance, and even failure.

It is advantageous to provide more secure bonding as well as reduction or elimination of problems caused by exposure of the bonding layer. It is with respect to these and other considerations that the present improvements have been needed. Such improvements may become critical as the desire to implement SOI devices becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
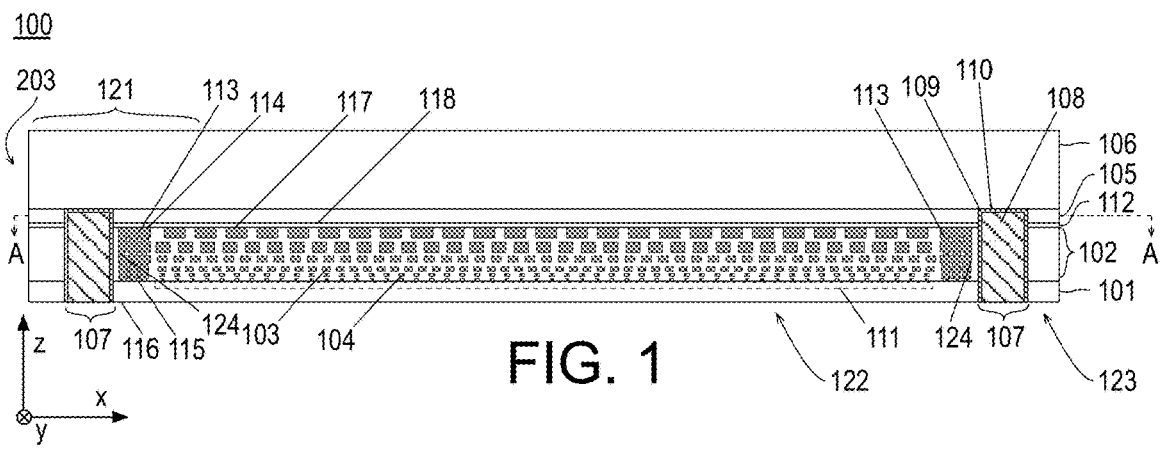
FIG. 1 is a cross-sectional view of an integrated circuit device including a guard ring structure.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direction contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Semiconductor devices, device structures, apparatuses, computing platforms, and methods are described below related to semiconductor on insulator technology and, in particular, to moisture hermetic guard ring structures for semiconductor on insulator devices.

As described above, it may be advantageous to provide more secure bonding and to reduce or eliminate problems caused by exposure of bonding layers in semiconductor (or silicon) on insulator (SOI) devices. As used herein, the term SOI device indicates a device formed using SOI techniques inclusive of forming devices on a device substrate or wafer, forming interconnects over the device layer, attaching the interconnect layer to a carrier substrate or wafer (via a bonding layer), and removing a bulk portion of the device substrate or wafer while leaving the device layer to expose a back side of the device layer. Traditionally, another substrate or wafer (i.e., a support substrate) is attached to the back side of the device layer (via an insulator bonding layer) and the carrier substrate or wafer is removed. Alternatively, the carrier substrate may remain as a part of the final product (i.e., as a support substrate).

In either case, a trench is formed in the resultant work piece such that the trench surrounds the semiconductor devices of the device layer and the metal interconnects of the interconnect layer and such that the trench extends through the device layer, the interconnect layer, and the bonding layer and lands on or within the support substrate. Notably, the trench may be formed by sequentially etching the device layer, the interconnect layer, and the bonding layer when the support substrate is on the interconnect layer side or by etching the interconnect layer, the device layer, and the bonding layer when the support substrate is on the device layer side. The resultant trench is then filled with a guard ring structure that laterally surrounds the devices of the device layer, the metal interconnects of the interconnect layer and an internal portion of the bonding layer. Therefore, the guard ring structure laterally surrounds a die including an integrated circuit. In some embodiments, the discussed techniques are performed at the wafer level, which is diced to provide each die with a guard ring as discussed.

The guard ring structure may include a liner (e.g., a polymer to aid in adhesion and/or smooth serrated sidewalls of the trench), a barrier layer (e.g., a metal oxide to block diffusion of a fill material and to again aid in adhesion of the fill material), and a fill material. In some embodiments, the fill material is copper. Notably, the guard ring structure blocks moisture from the bonding layer within the perimeter of the guard ring structure and thereby provides a hermetic guard ring to protect the bonding layer (and other materials) from becoming weaker due to moisture absorption and related problems due to the moisture caused during temperature cycling of the device in operation. Furthermore, the guard ring structure, largely due to the fill material, provides improved bonding energy and strength in the bond between the support substrate and the device layer/interconnect layer work piece relative to use of the bonding layer alone.

In addition, during such trench and guard ring structure formation, via structures, having the same materials as the guard ring may be formed interspersed within the region defined by the perimeter of the guard ring structure. Such via structures (e.g., through semiconductor or silicon vias, TSVs) may be employed for heat dissipation, grounding, or other uses. In particular, in embodiments where the support substrate is adjacent the interconnect layer (and therefore opposite the device layer), the thinned device layer may produce heat that is not dissipated by a bulk semiconductor material (which was removed) and may not have access to a ground plane. In such contexts, the guard ring structure may provide heat dissipation and/or connection to the ground plane. In addition or in the alternative, the via structures may provide such heat dissipation and/or ground plane connection. Such via structures may also be employed when the support substrate is adjacent the device layer (and therefore opposite the interconnect layer) as discussed further herein.

The disclosed techniques, device structures, devices, and systems herein provide a moisture blocking guard ring structure through a bonding layer and surrounding a die. As discussed, the guard ring structure may be formed in wafer-to-wafer fabrication work flows and provide a die that is resilient to delamination at the bond interface while providing the device advantages that SOI techniques afford. The resultant hermetic guard ring structure provides bond layer integrity to withstand thermo-mechanical stress coming from the package and other conditions of use for improved reliability.

Figure 2:
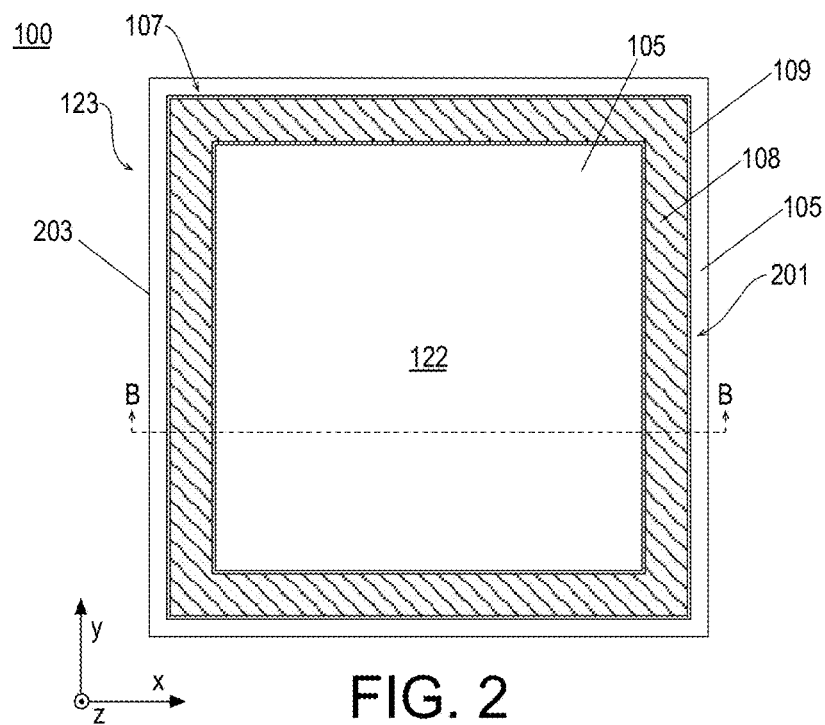
FIG. 2 is another cross-sectional view of the integrated circuit device of FIG. 1.

FIG. 1 is a cross-sectional view of an integrated circuit device 100 including a guard ring structure 107 and FIG. 2 is another cross-sectional view of integrated circuit device 100 including guard ring structure 107, arranged in accordance with at least some implementations of the present disclosure. As shown, FIG. 2 provides a view taken along the A-A plane in FIG. 1. FIG. 1, in turn, provides a view taken along the B-B plane in FIG. 2. Integrated circuit device 100 may also be characterized as a device structure or simply a device. As shown in FIG. 1, device 100 includes a device layer 101 including a number of semiconductor devices 111 (as illustrated with respect to an outlined device region) within an interior region 122 defined by guard ring structure 107 and in a region 123 outside of guard ring structure 107. It is noted that the portions of device layer 101 (and other layers) within region 122 are discontiguous with those portions outside of region 122 and in region 123. With reference to FIG. 2, region 122 is within a perimeter 201 defined by guard ring structure 107 and region 123 is outside of perimeter 201 defined by guard ring structure 107. Perimeter 201 may be any suitable shape such as rectangular, square (as shown), or other. Notably, as used herein the term ring indicates a surrounding of a region as defined by perimeter 201 but does indicate a circular or rounded shape of guard ring structure 107 or any elements thereof.

Returning to FIG. 1, device layer 101 may include any number and type of semiconductor devices 111 formed within a semiconductor substrate material. In some examples, device layer 101 includes a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. Semiconductor devices 111 within device layer 101 may include transistors, memory devices, capacitors, resistors, optoelectronic devices, switches, or any other active or passive electronic devices. Notably, no operable semiconductor devices are within region 123, although dummy structures may be formed in region 123 during the fabrication of semiconductor devices 111.

Device layer 101, as discussed further herein, is formed by removing bulk substrate material from a substrate in which and/or on which device layer 101 is formed. Device layer 101 may have any suitable thickness (in the z-dimension) such as a thickness in the range of 5 to 20 nm, a thickness in the range of 10 to 25 nm, or a thickness in the range of 20 to 50 nm, or larger. In any case, device layer 101 is thin and fragile and requires support a by a support substrate 106 during manufacture and in use.

Device 100 includes an interconnect layer 102 on device layer 101 such that interconnect layer 102 includes metal interconnects 103 interspersed among dielectric material 104. As with semiconductor devices 111, metal interconnects 103 are within region 122 and absent region 123 although dummy structures and package level interconnects may be provided in region 123. Metal interconnects 103 may include any metal materials such as copper, aluminum, etc. and metal interconnects 103 electrically couple devices 111 to one another and/or to device level interconnects for connection to an outside package, package substrate, motherboard, etc. For example, metal interconnects 103 may include alternating layers of metal lines and vias that become progressively larger moving away from device layer 101.

In some embodiments, interconnect layer 102 further includes an interconnect guard ring 113 formed during the formation of metal interconnects 103 and having the same materials as metal interconnects 103. Interconnect guard ring 113 laterally surrounds metal interconnects 103. As used herein, the term laterally surrounds indicates the interior items and/or layer or portion thereof are surrounded along the plane of the layer that the items are part of but not outside of that plane. In the illustration of FIG. 1, the term lateral indicates a direction in the x-y plane. As shown, although interconnect guard ring 113 laterally surrounds metal interconnects 103, interconnect guard ring 113 does not laterally surround device layer 101 nor any other layers of device layer 101 as devices 111, device layer 101, and other layers (discussed below) are not laterally aligned with interconnect guard ring 113 and indeed extend outside of an outer edge 124 of interconnect guard ring 113. Although illustrated herein as inclusive of interconnect guard ring 113, in some embodiments, interconnect guard ring 113 is absent.

Device 100 further includes a passivation layer 112 on interconnect layer 102. As shown, passivation layer 112 includes a portion within region 122 and a portion outside of region 122 and in region 123. Passivation layer 112 may include any suitable material or materials to protect interconnect layer 102 such as polymer materials. Passivation layer 112 may have any suitable thickness (e.g., in the z-dimension) such as 1 to 4 microns. In some embodiments, passivation layer 112 may be characterized as included in interconnect layer 102. Device 100 includes a bonding layer 105 on passivation layer 112 (or interconnect layer 102). Bonding layer 105 bonds passivation layer 112 (or interconnect layer 102 in the absence of passivation layer 112) to a support substrate 106.

Support substrate 106 may be any suitable material or material such as any of those discussed with respect to the substrate of device layer 101. For example, support substrate 106 may include monocrystalline silicon, germanium, silicon germanium, a III-V materials based material (e.g., gallium arsenide), a silicon carbide, a sapphire, or any combination thereof. In some embodiments, the substrate of device layer 101 and support substrate 106 are silicon substrates. In some embodiments, support substrate 106 has a thickness (in the z-dimension) in the range of 500 to 750 microns, a thickness in the range of 600 to 850 microns, or a thickness in the range of 800 to 950 microns. In some embodiments, bonding layer 105 is formed by providing an oxide (e.g., SiOx) on one or both of passivation layer 112 and a surface of support substrate 106 (with oxidation of both being advantageous), bringing them in close contact such that they bond via van der Waals forces (e.g., at room temperature), and annealing to provide covalent bonding. However, any suitable technique or techniques for permanent bonding may be used. As shown, as with device layer 101, interconnect layer 102, and passivation layer 112, a portion of bonding layer 105 is within region 122 and a portion is outside of region 122 and in region 123.

As discussed, device 100 includes guard ring structure 107 laterally surrounding semiconductor devices 111 of device layer 101, metal interconnects 103 of interconnect layer 102, a portion of passivation layer 112, and a portion of bonding layer 105 such that guard ring structure 107 defines region 122 within guard ring structure 107 and region 123 outside of guard ring structure 107. As discussed, guard ring structure 107 laterally surrounds devices 111 of device layer 101, metal interconnects 103 of interconnect layer 102, a portion of passivation layer 112, and a portion of bonding layer 105 such that guard ring structure 107 is lateral (in the x-y plane) and around such components.

Furthermore, guard ring structure 107 extends through device layer 101, interconnect layer 102, passivation layer 112, and bonding layer 105 and is in contact with support substrate 106. As used herein, the term extends through with respect to a component indicates the component penetrates both sides of a layer and is surrounded (at least partially) by the layer. For example, interconnect guard ring 113 extends through a surface 117 of interconnect layer 102 but terminates at (and therefore does not extend through) a surface 114 of passivation layer 112 and a surface 115 of device layer 101. In contrast, guard ring structure 107 extends through device layer 101 such that it extends through both surface 115 of device layer 101 and a surface 116 of device layer 101 opposite surface 115, extends through interconnect layer 102 including surface 117, extends through passivation layer 112 including surface 114 and a surface 118 of passivation layer 112 opposite surface 114, and bonding layer 105 including both surfaces thereof, and terminates at support substrate 106. In the example of FIG. 1, guard ring structure 107 terminates at surface 110 of support substrate 106. In some embodiments, guard ring structure 107 may extend through surface 110 and terminate within the bulk material of support substrate 106 as discussed with respect to FIG. 4 herein below.

Guard ring structure 107 provides a hermetic seal, improved bond strength, and/or improved mechanical properties for device 100. Notably, with reference to FIG. 2, an edge 203 of device 100 may be exposed to moisture and in implementation, moisture taken on by bonding layer 105 (or other layers) is blocked by guard ring structure 107. For example, edge 203 includes edges of device layer 101, interconnect layer 102, passivation layer 112, bonding layer 105, and support substrate 106, which may be established during a dicing operation. In some embodiments, such edges are substantially aligned horizontally and share an edge in the z-dimension). Without guard ring structure 107, such moisture causes reduction in interfacial adhesion strength between bonding layer 105 and support substrate 106 and/or between bonding layer 105 and passivation layer 112 and can ultimately cause delamination and failure under thermomechanical stress in use. Furthermore, guard ring structure 107 provides improved bond strength with support substrate 106 as well as other improved mechanical properties such as capability to take on load during mechanical stress.

As shown, guard ring structure 107 may include a barrier layer 109 and a fill material 108 such that fill material 108 is within barrier layer 109. Guard ring structure 107 may also include a liner as discussed below such that a barrier layer 109 is within the liner and fill material 108 is, in turn, within barrier layer 109. In some material systems, guard ring structure 107 includes only fill material 108. Fill material 108 may include any suitable material that provides a hermetic seal, improved bond strength, and/or improved mechanical properties for device 100. In some embodiments, fill material 108 is a metal. For example, fill material 108 may include copper, aluminum, tungsten, titanium, or any combination thereof. In an embodiment, fill material 108 is copper having a purity of not less than 99% by weight.

Barrier layer 109 may also include any suitable material that provides, for example, improved adhesion for fill material 108, diffusion blocking for fill material 108, and/or improvements for guard ring structure 107 in terms of the previously discussed hermetic seal, improved bond strength, and/or improved mechanical properties. In some embodiments, barrier layer 109 is a metal oxide or combinations of metal oxides such as titanium oxide or tantalum oxide. In some embodiments, barrier layer 109 includes titanium oxide (i.e., titanium and oxygen) and fill material 108 includes copper.

Figure 3:
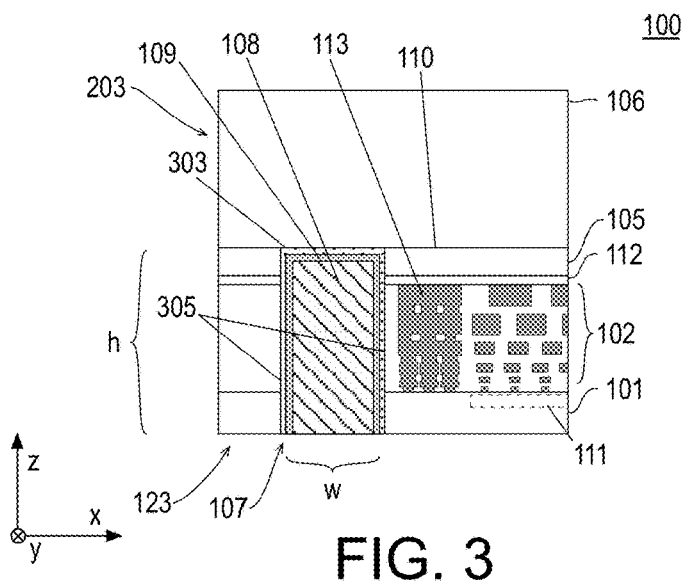
FIG. 3 is a close up view of the integrated circuit device of FIG. 1 inclusive of a liner in the guard ring structure.

FIG. 3 is a close up view of integrated circuit device 100 taken at region 121 and inclusive of a liner in guard ring structure 107, arranged in accordance with at least some implementations of the present disclosure. As shown in FIG. 3, guard ring structure 107 may further include a liner 303. Liner 303 may include any suitable material such as a polymer material for improved adhesion and/or to smooth serrated sidewalls of a trench in which guard ring structure 107 is formed. For example, as discussed further herein, a patterned trench may be formed by removing patterned portions of device layer 101, interconnect layer 102, passivation layer 112, and bonding layer 105. Such material removal may be performed using etch or other techniques and may provide a trench having serrated sidewalls or sidewalls that are otherwise not smooth. Application of liner 303 may advantageously provide smooth sidewalls, fill potential void spaces, and otherwise improve subsequent fill operations.

Notably, guard ring structure 107 may include barrier layer 109 only, liner 303 only, or barrier layer 109 and liner 303 in addition to fill material 108. Guard ring structure 107 has a thickness or height, h, in the z-dimension (inclusive of any materials in the implemented material system) substantially defined by the thickness or heights of device layer 101, interconnect layer 102, passivation layer 112, and bonding layer 105. For example, guard ring structure 107 may have a height in the range of 15 to 20 microns, a height in the range of 18 to 22 microns, or a height in the range of 20 to 25 microns. The lateral width, w, of guard ring structure 107 (inclusive of any materials in the implemented material system) taken between sidewalls 305 of guard ring structure 107 may be any suitable width to provide the desired hermetic seal, improved bond strength, and/or improved mechanical properties. In some embodiments, guard ring structure 107 has a width between sidewalls 305 in the range of 3 to 5 microns, a width between sidewalls 305 in the range of 4 to 6 microns, or a width between sidewalls 305 in the range of 4.5 to 5.5 microns. Notably, widths of larger than about 5 to 6 microns may be employed but offer reducing returns in the discussed advantages.

Figure 4:
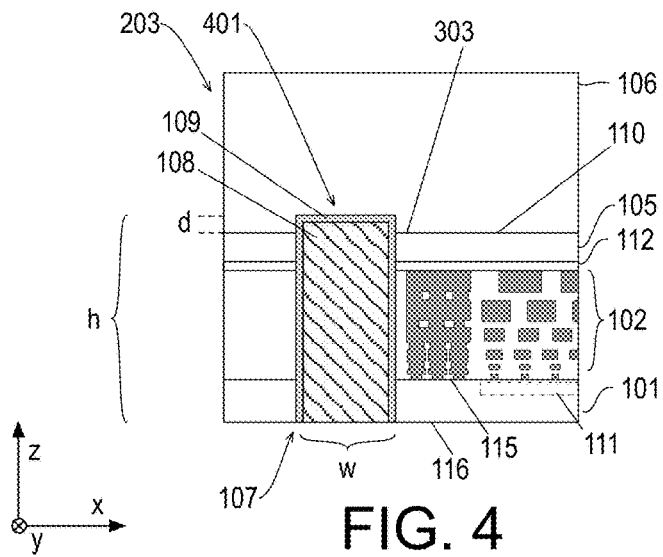
FIG. 4 is a close up view of the integrated circuit device of FIG. 1 showing a guard ring structure extending into a portion of a support substrate.

FIG. 4 is a close up view of integrated circuit device 100 taken at region 121 and showing guard ring structure extending into a portion of support substrate 106, arranged in accordance with at least some implementations of the present disclosure. Although not illustrated in FIG. 4, and in other contexts herein, liner 303 may be employed in any guard ring structure 107 discussed herein. With reference to FIGS. 1 and 3, in some embodiments guard ring structure 107 lands on surface 110 of support substrate 106 such that guard ring structure 107 does not substantially penetrate into a bulk material of support substrate 106. For example, an etch selectively may exist between support substrate 106 and bonding layer 105 such that the etch of bonding layer 105 does not substantially etch support substrate 106 and a landing on surface 110 may be provided.

In some embodiments, as shown in FIG. 4, guard ring structure 107 extends within a portion 401 of support substrate 106 such that guard ring structure 107 extends to a depth (in the z-dimension), d, of support substrate 106. Such techniques may provide for improved desired hermetic seal, improved bond strength, and/or improved mechanical properties with respect to landing on surface 110. In some embodiments, portion 401 may be removed via an additional substrate (e.g., semiconductor or silicon) etch after the etch of bonding layer 105. Guard ring structure 107 may extend into support substrate 106 by any suitable dimension such as a depth in the range of 50 to 200 nm, a depth in the range of 200 to 500 nm, a depth in the range of 500 to 1,000 nm, or more. In some embodiments, Guard ring structure 107 may extend into support substrate 106 at a depth of not less than 200 nm.

As discussed, bonding layer 105 and support substrate 106 are provided adjacent to interconnect layer 102 in some embodiments. In other embodiments, bonding layer 105 and support substrate 106 are provided adjacent to device layer 101.

Figure 5:
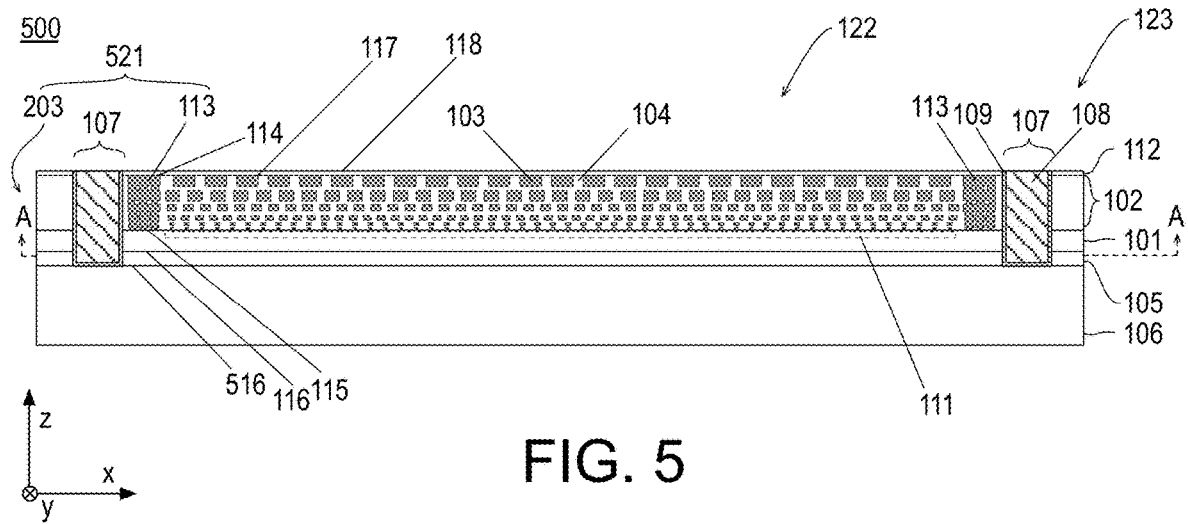
FIG. 5 is a cross-sectional view of another integrated circuit device including a guard ring structure.

FIG. 5 is a cross-sectional view of an integrated circuit device 500 including guard ring structure 107, arranged in accordance with at least some implementations of the present disclosure. Notably, FIG. 2 also provides a view taken along the A-A plane in FIG. 5. Integrated circuit device 500 may also be characterized as a device structure or simply a device. Like numerals or components in integrated circuit device 500 with respect to device 100, and herein throughout, may have any characteristics discussed with reference thereto. As shown in FIG. 5, device 500 includes device layer 101 inclusive of semiconductor devices 111 within region 122 defined by guard ring structure 107 and extending to region 123 outside of guard ring structure 107. As discussed, region 122 is within perimeter 201 defined by guard ring structure 107 and region 123 is outside of perimeter 201 as defined by guard ring structure 107.

As shown, interconnect layer 102 is on device layer 101 and includes metal interconnects 103 and dielectric material 104 such that metal interconnects 103 are within region 122. Furthermore, as discussed, interconnect layer 102 may include interconnect guard ring 113 laterally surrounding metal interconnects 103 and dielectric material 104 (but not other layers of device 500). Device 500 further includes passivation layer 112 on interconnect layer 102 such that passivation layer 112 includes a portion within region 122 and a portion outside of region 122 and in region 123. Furthermore, device 500 includes bonding layer 105 on device layer 101 such that bonding layer 105 bonds device layer 101 to support substrate 106, which, as discussed, provides structural support for device layer 101 and interconnect layer 102. In some embodiments, bonding layer 105 is formed by providing an oxide (e.g., SiOx) on both of device layer 101 (i.e., a backside surface of device layer 101) and a surface of support substrate 106, bringing them in close contact such that they bond via van der Waals forces (e.g., at room temperature), and annealing to provide covalent bonding. As shown, as with device layer 101, interconnect layer 102, and passivation layer 112, a portion of bonding layer 105 is within region 122 and a portion is outside of region 122 and in region 123.

Guard ring structure 107 of device 500, as with device 100, laterally surrounds a portion of passivation layer 112, metal interconnects 103 of interconnect layer 102, semiconductor devices 111 of device layer 101, and a portion of bonding layer 105 such that guard ring structure 107 defines region 122 within guard ring structure 107 and region 123 outside of guard ring structure 107. Guard ring structure 107 laterally surrounds semiconductor devices 111 of device layer 101, metal interconnects 103 of interconnect layer 102, a portion of passivation layer 112, and a portion of bonding layer 105 in that guard ring structure 107 is lateral and fully around (in the x-y plane) such components. Guard ring structure 107 also extends through passivation layer 112 (i.e., both surfaces 114, 118 of passivation layer 112), interconnect layer 102 (i.e., both opposing surfaces of interconnect layer 102), device layer 101 (i.e., both surfaces 115, 116 of device layer 101), and bonding layer 105 (i.e., both opposing surfaces of bonding layer 105) and is in contact with support substrate 106. Notably, interconnect guard ring 113 again extends through interconnect layer 102 but terminates at surface 114 of passivation layer 112 and surface 115 of device layer 101 while guard ring structure 107 extends through both surfaces of each of passivation layer 112, interconnect layer 102, device layer 101, and bonding layer 105 and terminates at or within support substrate 106. In the example of FIG. 5, guard ring structure 107 terminates at a surface 516 of support substrate 106. In some embodiments, guard ring structure 107 may terminate within the bulk material of support substrate 106 beyond surface 516 as discussed with respect to FIG. 6.

As discussed with respect to device 100, guard ring structure 107 in device 500 provides a hermetic seal, improved bond strength, and/or improved mechanical properties for device 100. Furthermore, guard ring structure 107 may include fill material 108 only, barrier layer 109 and fill material 108, liner 303 and fill material 108, or liner 303, barrier layer 109 and fill material 108, as discussed herein. Any material system for guard ring structure 107 discussed herein may be employed in device 500.

Figure 6:
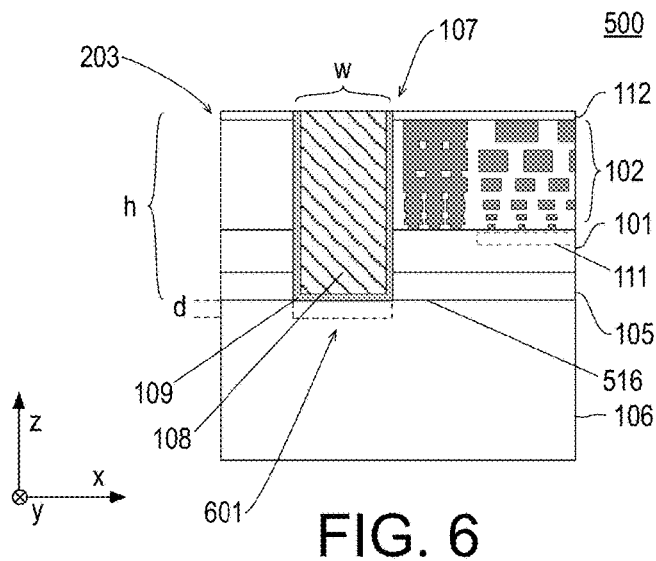
FIG. 6 is a close up view of the integrated circuit device of FIG. 5.

FIG. 6 is a close up view of integrated circuit device 100 taken at region 521, arranged in accordance with at least some implementations of the present disclosure. As shown in FIG. 6, guard ring structure 107 may have a height, h, and a width, w, inclusive of any suitable values such as those discussed with respect to FIG. 3. Also as shown in FIG. 6, in some embodiments, guard ring structure 107 ends or terminates at surface 516 of support substrate 106. In other embodiments, ring structure 107 extends to a depth, d, (in the z-dimension) of support substrate 106 within a portion 601 of removed support substrate 106 at any suitable depth such as a depth in the range of 50 to 200 nm, a depth in the range of 200 to 500 nm, a depth in the range of 500 to 1,000 nm, or a depth of not less than 200 nm. Although illustrated with a material system inclusive of barrier layer 109 and fill material 108 any material system may be employed in device 500 such as fill material 108 only or liner 303, barrier layer 109, and fill material 108.

Notably, device 500 provides a device that may be packaged via device interconnects formed over passivation layer 112, which are bonded to a package substrate, and a thermal solution or heat exchanger may be provided on support substrate 106. Such structures and techniques are discussed herein with respect to FIG. 21. In contrast, with reference to FIG. 1, device 100 provides a device that may be packaged via device interconnects formed over device layer 101, which are bonded to a package substrate, and a thermal solution or heat exchanger may be provided on support substrate 106. Such structures and techniques are discussed herein with respect to FIG. 16. In either case, it may be advantageous to provide via structures or vias (e.g., through semiconductor or silicon vias) in concert with the discussed guard ring structure 107.

Figure 7:
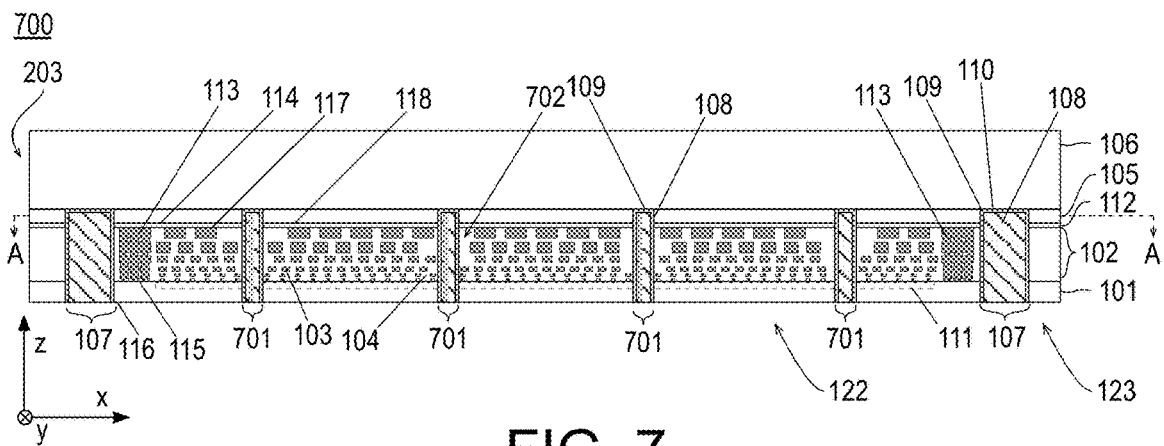
FIG. 7 is a cross-sectional view of an integrated circuit device including a guard ring structure 107 and corresponding via structures.
Figure 8:
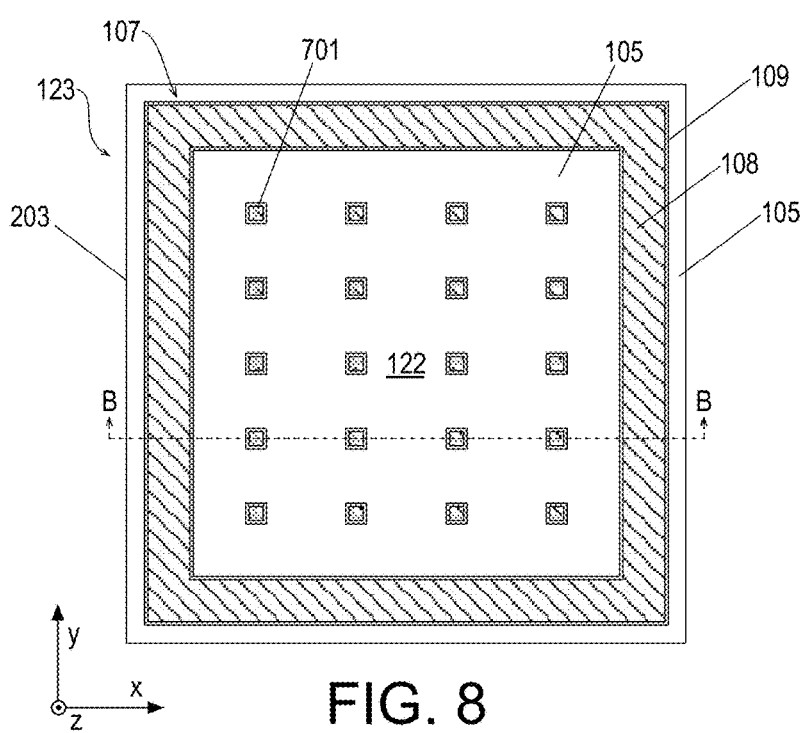
FIG. 8 is another cross-sectional view of the integrated circuit device of FIG. 7.

FIG. 7 is a cross-sectional view of an integrated circuit device 700 including guard ring structure 107 and corresponding via structures 701 and FIG. 8 is another cross-sectional view of integrated circuit device 700 including guard ring structure 107 and via structures 701, arranged in accordance with at least some implementations of the present disclosure. As shown, FIG. 8 provides a view taken along the A-A plane in FIG. 7. FIG. 7, in turn, provides a view taken along the B-B plane in FIG. 8. Integrated circuit device 700 may also be characterized as a device structure or a device. Like numerals or components in integrated circuit device 500 with respect to device 100, and herein throughout, may have any characteristics discussed with reference thereto.

Notably, relative to device 100, device 700 further includes via structures 701. Via structures 701, or simply vias, are interspersed within region 122 such that via structures 701 may be employed in a grid pattern (as shown) or any other pattern. In some embodiments, a single via structure 701 is used. Notably, via structures 701 have the same materials (i.e., any one or more of fill material 108, barrier layer 109, and liner 303 as those of guard ring structure 107.

For example, guard ring structure 107 and via structures 701 are fabricated during the same processing operations as discussed further herein below. As shown, via structures 701 also extend through device layer 101, interconnect layer 102, passivation layer 112, and bonding layer 105 and are in contact with support substrate 106 in the same manner as guard ring structure 107. In the example of FIG. 7, guard ring structure 107 and via structures 701 terminate at surface 110 of support substrate 106. In other embodiments, guard ring structure 107 and via structures 701 terminate within the bulk material of support substrate 106 as discussed with respect to FIG. 4.

As shown, void regions 702 in metal interconnects 103 are provided in interconnect layer 102 to provide routing for via structures 701. Via structures 701 may be used to dissipate heat from device layer 101, to provide a ground plane connection for device layer 101, or any other purpose. Such heat dissipation and/or ground plane connection may be provided in addition or in the alternative by guard ring structure 107. That is, in embodiments absent via structures 701, guard ring structure 107 may be used as a ground plane connection and/or for heat dissipation.

As discussed, via structures 701 have the same materials as guard ring structure 107 inclusive of any discussed herein. In some embodiments, guard ring structure 107 and via structures 701 include a polymer liner 303, a metal oxide barrier layer 109, and a copper fill 108. In some embodiments, guard ring structure 107 and via structures 701 include only a metal oxide barrier layer 109 and a copper fill 108. Also, as shown, via structures 701 have the same height as guard ring structure 107 but, typically, a smaller width. In some embodiments, via structures 701 have a width in the range of 0.5 to 1 microns, a width in the range of 0.75 to 1.5 microns, or a width in the range of 1 to 2 microns. In some embodiments, the lower limit of the width of via structures 701 is limited by the etch used to form them.

Figure 9:
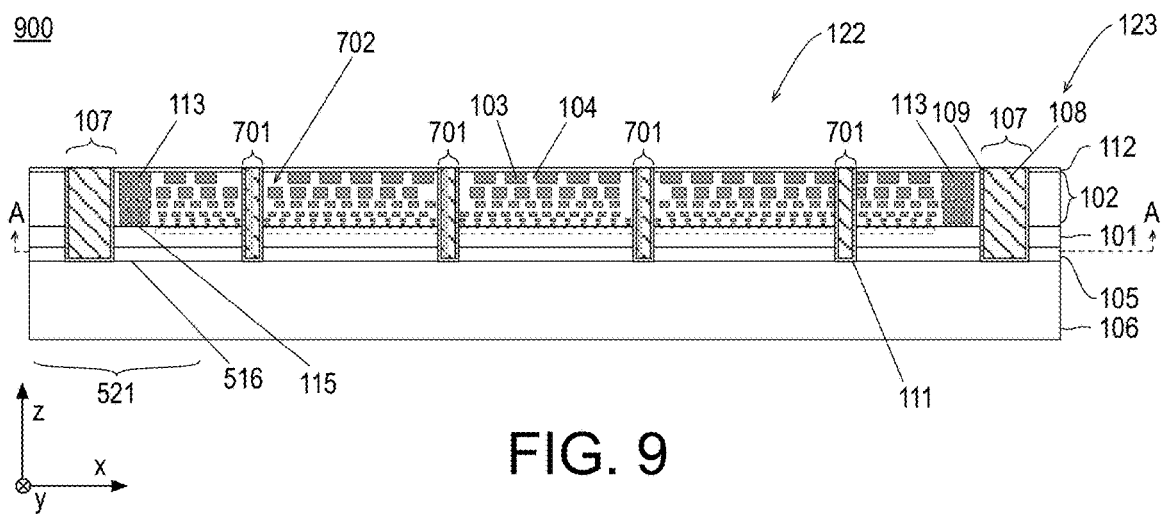
FIG. 9 is a cross-sectional view of another integrated circuit device including a guard ring structure and corresponding via structures.

FIG. 9 is a cross-sectional view of an integrated circuit device 900 including guard ring structure 107 and corresponding via structures 701, arranged in accordance with at least some implementations of the present disclosure. Notably, FIG. 9 also provides a view taken along the A-A plane in FIG. 8. Integrated circuit device 900 may also be characterized as a device structure or simply a device. Like numerals or components in integrated circuit device 900 with respect to device 500, and herein throughout, may have any characteristics discussed with reference thereto.

Notably, relative to device 500, device 900 also includes via structures 701. Via structures 701 are interspersed within region 122 such that via structures 701 may be employed in a grid pattern (as shown) or any other pattern. In some embodiments, a single via structure 701 is used. As discussed, via structures 701 have the same materials (i.e., any one or more of fill material 108, barrier layer 109, and liner 303 as those of guard ring structure 107. For example, guard ring structure 107 and via structures 701 are fabricated during the same processing operations as discussed further herein below. As shown, as with guard ring structure 107, via structures 701 extend through passivation layer 112, interconnect layer 102, device layer 101, and bonding layer 105 and are in contact with support substrate 106. In the illustrated embodiment, guard ring structure 107 and via structures 701 terminate at surface 516 of support substrate 106. In some embodiments, and via structures 701 terminate within the bulk material of support substrate 106 as discussed with respect to FIG. 6. As with device 700, via structures 701 may be used to dissipate heat from device layer 101, to provide a ground plane connection for device layer 101, or any other purpose. Such heat dissipation and/or ground plane connection may be provided in addition or in the alternative by guard ring structure 107. That is, in embodiments absent via structures 701, guard ring structure 107 may be used as a ground plane connection and/or for heat dissipation.

Figure 10:
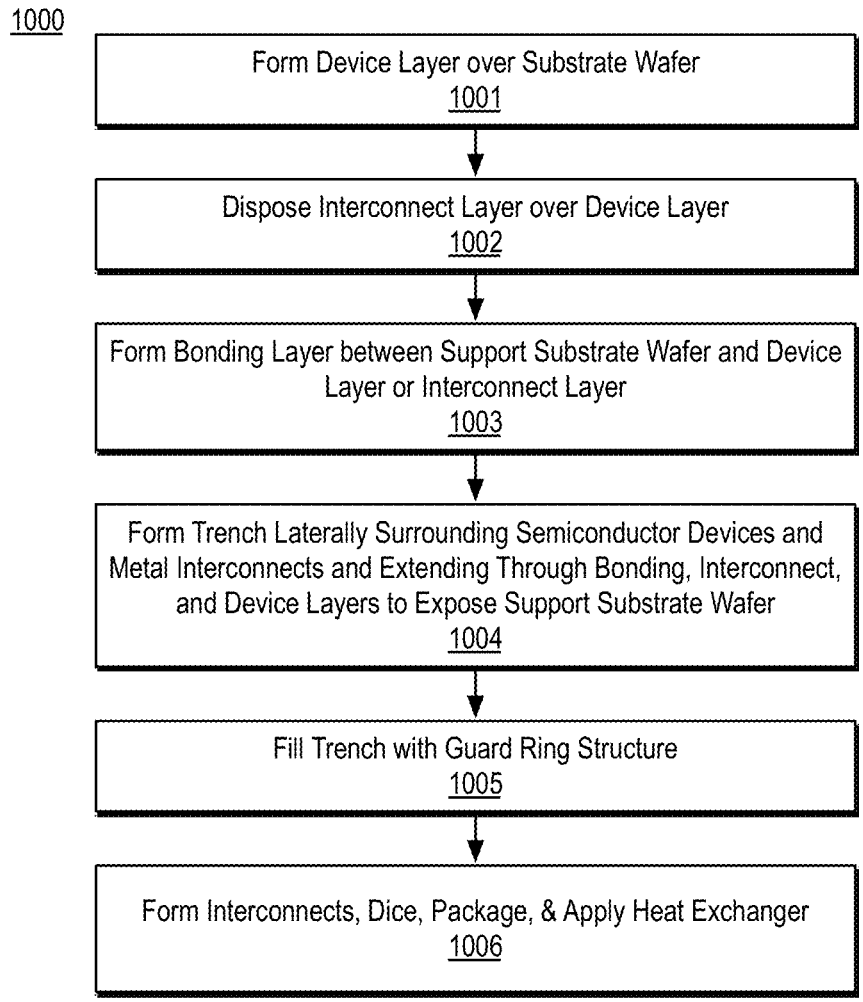
FIG. 10 is a flow diagram illustrating methods for forming integrated circuit device structures with hermetic guard ring structures.

FIG. 10 is a flow diagram illustrating methods 1000 for forming integrated circuit device structures with hermetic guard ring structures, arranged in accordance with at least some implementations of the present disclosure. FIGS. 11, 12, 13, 14, 15, 16, 17, 18, 19, 20, and 21 are cross-sectional views of exemplary device structures as selected fabrication operations in methods 1000 are performed, arranged in accordance with at least some implementations of the present disclosure. It is noted that FIGS. 11, 12, 13, 14, 15, and 16 provide a first fabrication sequence and FIGS. 11, 12, 13, 17, 18, 19, 20, and 21 provide a second fabrication sequence.

As shown in FIG. 10, methods 1000 begin at operation 1001, where a substrate wafer is received for processing and a device layer is formed within, on, and/or over the substrate wafer. The substrate wafer may be received for processing using any suitable technique or techniques and may include any materials or characteristics discussed with respect to the substrate of device layer 101. The device layer formed within, on, and/or over the substrate wafer may include any devices discussed herein such as transistors, memory devices, capacitors, resistors, optoelectronic devices, switches, or any other active or passive electronic devices. Such devices may be performed using any suitable technique or techniques known in the art. Methods 1000 continue at operation 1002, where an interconnect layer is formed over the device layer. The interconnect layer includes any number of layers of metal interconnects and vias interspersed among dielectric material 104. Such metal interconnects and vias may be formed using suitable technique or techniques known in the art.

Figure 11:
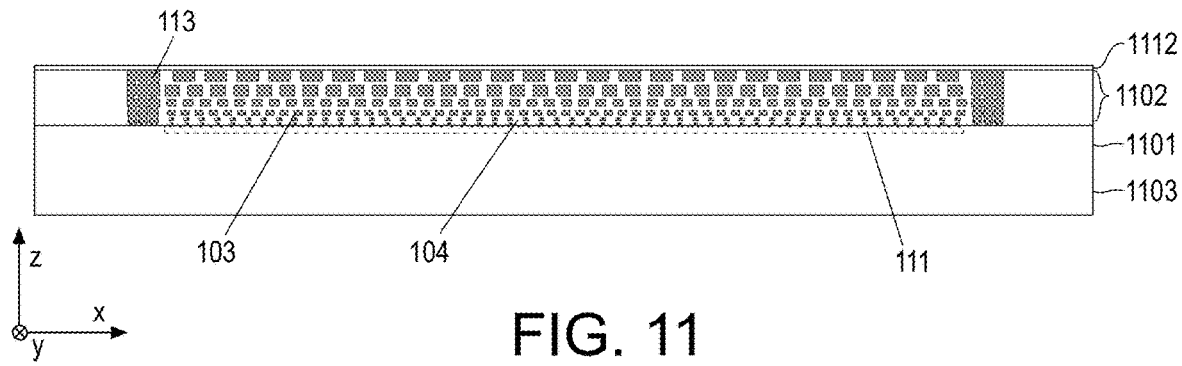
FIGS. 11, 12, 13, 14, 15, 16, 17, 18, 19, 20, and 21 are cross-sectional views of exemplary device structures as selected fabrication operations in the methods of FIG. 1 are performed.

FIG. 11 illustrates an example device structure 1100 including an example substrate wafer 1101, example semiconductor devices 111, an exemplary interconnect layer 1102, and an exemplary passivation layer 1112. For example, substrate wafer 1101 may be a 200 mm, 300 mm, 450 mm or any other size wafer received for processing. Substrate wafer 1101 may include any suitable substrate for forming devices 111 such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. Substrate wafer 1101 may have any thickness such as a thickness in the range of 500 to 950 microns. Notably, devices 111 are formed within a small fraction (on the order of nanometers) of the thickness of substrate wafer 1101. Furthermore, control of dopants and other characteristics of devices are difficult to control through the thickness of substrate wafer 1101 and, therefore, the following techniques may be used to eliminate negative effects corresponding to such uncontrollable regions along the depth of substrate wafer 1101. Furthermore, substrate wafer 1101 includes a sacrificial portion 1103 (or bulk portion) that will be subsequently removed.

FIG. 11 further illustrates interconnect layer 1102 and passivation layer 1112, which may have any characteristics discussed herein with respect to interconnect layer 102 and passivation layer 112, although interconnect layer 1102 and passivation layer 1112 are not yet patterned and separated into regions 122, 123. Notably, the cross-section of device structure 1100 illustrates a single example integrated circuit device or die, however device structure 1100 may include (across substrate wafer 1101 in the x-y plane) any number of such integrated circuit devices or dies.

Figure 12:
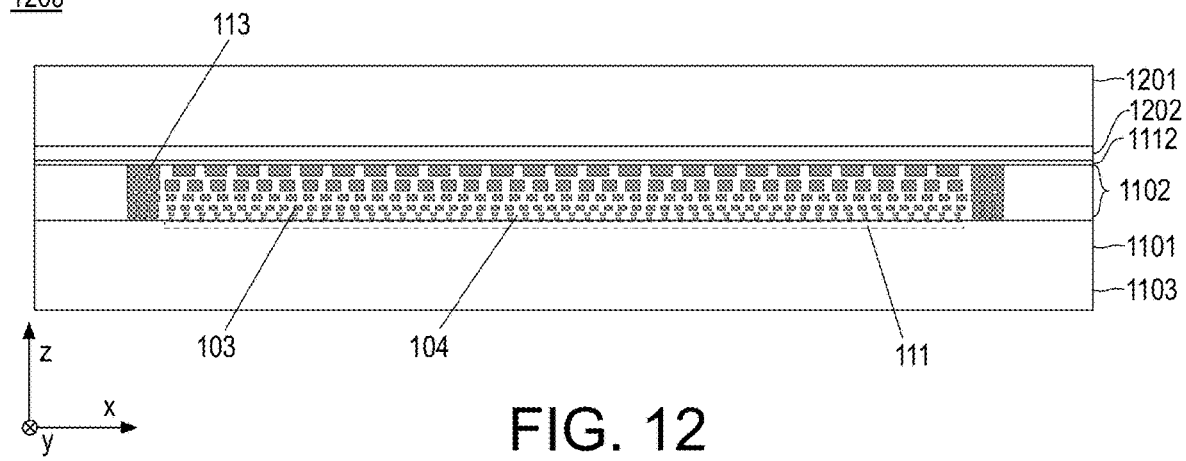
Figure 13:
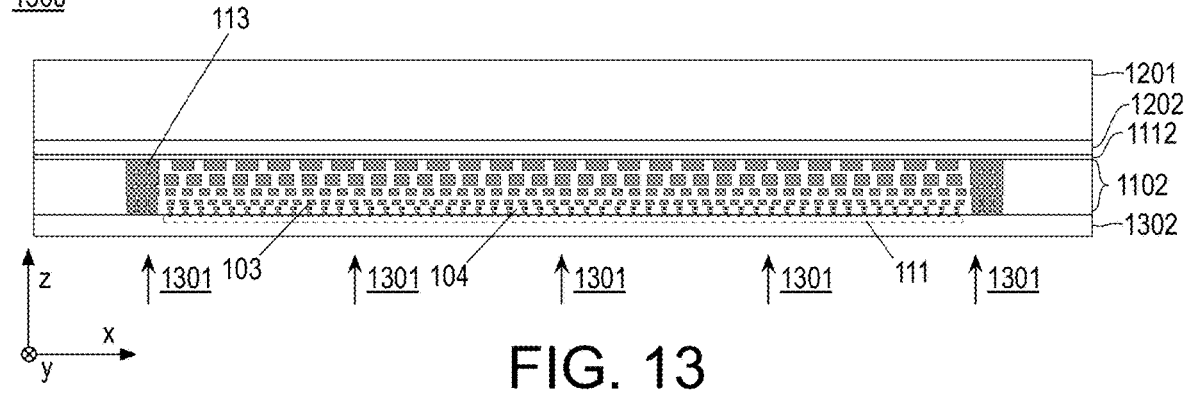

Returning to FIG. 10, methods 1000 continue at operation 1002, where a bonding layer is formed between a support substrate wafer and one of a device layer or an interconnect layer. That is, the support substrate wafer is attached, via a bonding layer to the interconnect layer formed at operation 1002 or to the device layer (after backside substrate removal using a sacrificial support wafer) formed at operation 1001. FIGS. 12 and 13 are pertinent to permanently attaching the support substrate wafer on the interconnect layer side and are discussed first. FIGS. 12, 13, 17, and 18 are pertinent to permanently attaching the support substrate wafer on the device layer side are discussed subsequently. It is noted that, when applicable to attaching the support substrate wafer on the interconnect layer side, the support substrate wafer of FIGS. 12 and 13 may be characterized as permanent (as portions thereof will remain when the die packaged) while, when applicable to attaching the support substrate wafer on the interconnect layer side, the support substrate wafer of FIGS. 12 and 13 may be characterized as sacrificial or temporary (as it will be removed during subsequent fabrication).

FIG. 12 illustrates an example device structure 1200, similar to device structure 1100, after an example support substrate wafer 1201 is coupled, via a bonding layer 1202, to passivation layer 112 (or another layer of interconnect layer 102). Support substrate wafer 1201 may include any material or characteristics discussed herein with respect to support substrate 106. For example, support substrate wafer 1201 may include monocrystalline silicon, germanium, silicon germanium, a III-V materials based material (e.g., gallium arsenide), a silicon carbide, a sapphire, or any combination thereof. In some embodiments, the materials of substrate wafer 1101 and support substrate wafer 1201 are the same. In some embodiments, they are both silicon substrate wafers. In some embodiments, support substrate wafer 1201 has a thickness (in the z-dimension) in the range of 500 to 750 microns, a thickness in the range of 600 to 850 microns, or a thickness in the range of 800 to 950 microns.

Support substrate wafer 1201 may be bonded, via a bonding layer 1202, to passivation layer 1112, which may be characterized as part of interconnect layer 1102, or to another layer of interconnect layer 1102 using any suitable technique or techniques. In some embodiments, an oxide layer is formed on both of support substrate wafer 1201 and passivation layer 1112. In some embodiments, support substrate wafer 1201 and substrate wafer 1101 are then brought into close proximity and bonded using van der Waals forces (e.g., the wafers are snapped together). In some embodiments, a subsequent anneal operation is performed to provide covalent bonds.

FIG. 13 illustrates an example device structure 1300, similar to device structure 1200, after backside removal 1301 of sacrificial portion 1103 of substrate wafer 1101 to leave device layer 1302. Backside removal 1301 of sacrificial portion 1103 may be performed using any suitable technique or techniques. In some embodiments, backside removal 1301 includes backside grind techniques, etch techniques, or combinations thereof. Notably, support substrate wafer 1201 is necessary during such processing to thin device layer 1302 to a thickness (on the order of nanometers) as required by SOI technology applications. Device layer 1302 may have any characteristics discussed herein with respect to device layer 101 although device layer 1302 is not yet patterned and separated into regions 122, 123.

With reference to operation 1003 of FIG. 10, such processing forms a bonding layer (e.g., bonding layer 1202) between a support substrate wafer (e.g., support substrate wafer 1201) and interconnect layer 1102. In this context, bonding layer 1202 is permanent and may have any characteristics discussed with respect to bonding layer 105 although bonding layer 1202 is not yet patterned and separated into regions 122, 123.

Discussion now turns to forming a bonding layer between a support substrate and a device layer. Such processing is also illustrated as continuing from device structure 1100 of FIG. 11 to device structure 1200 of FIG. 12, where support substrate wafer 1201 is coupled, via bonding layer 1202, to passivation layer 1112 (or another layer of interconnect layer 1102). In this fabrication flow, support substrate wafer 1201 is a sacrificial support substrate and may include any material or characteristics suitable for later removal. Furthermore, bonding layer 1202 is also selected such that it is subsequently removed. For example, bonding layer 1202, in such examples may be a UV sensitive adhesive that is releasable under UV radiation and sacrificial support substrate wafer 1201 may be translucent with respect to such UV radiation. However, any releasable bonding layer 1202 may be employed.

Processing then continues as shown with respect to FIG. 13, where backside removal 1301 of the sacrificial portion of substrate wafer 1101 is performed to leave device layer 1302. Backside removal 1301 may be performed using any suitable technique or techniques such as backside grind techniques, etch techniques, or combinations thereof, as discussed above. In this context, sacrificial support substrate wafer 1201 is again necessary to thin device layer 1302 to a thickness (on the order of nanometers) as required by SOI technology applications.

Figure 17:
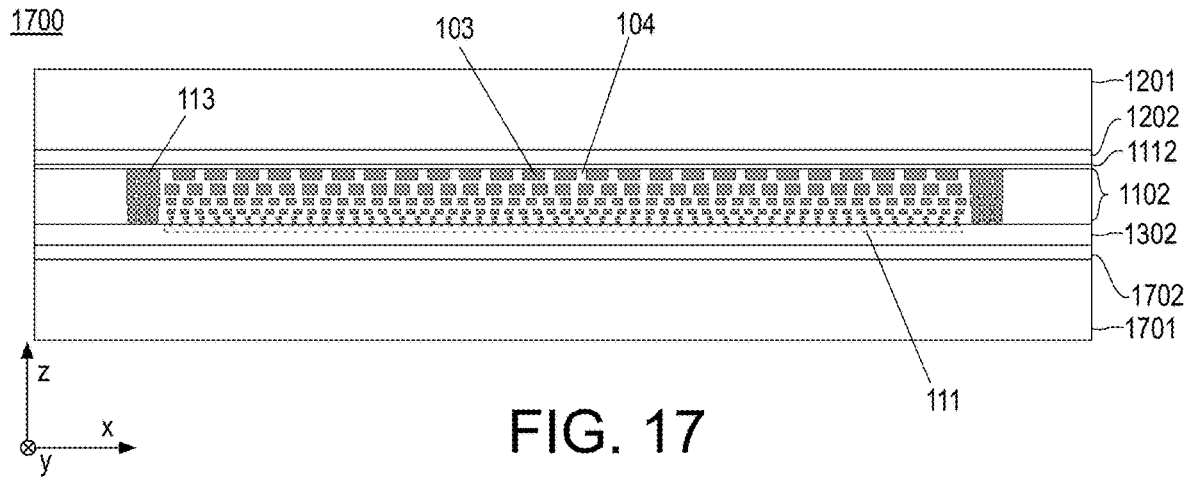

Processing continues as shown with respect to FIG. 17. FIG. 17 illustrates an example device structure 1700, similar to device structure 1300, after support substrate wafer 1701 is coupled, via a bonding layer 1702, to device layer 1302 (i.e., to a backside surface of device layer 101). Support substrate wafer 1701 may include any material or characteristics discussed herein with respect to support substrate 106. For example, support substrate wafer 1701 may include monocrystalline silicon, germanium, silicon germanium, a III-V materials based material (e.g., gallium arsenide), a silicon carbide, a sapphire, or any combination thereof. In some embodiments, the materials of substrate wafer 1101 and support substrate wafer 1701 are the same. In some embodiments, they are both silicon substrate wafers. In some embodiments, support substrate wafer 1701 has a thickness (in the z-dimension) in the range of 500 to 750 microns, a thickness in the range of 600 to 850 microns, or a thickness in the range of 800 to 950 microns.

Support substrate wafer 1701 may be bonded, via a bonding layer 1702, to device layer 1302 (i.e., to a backside surface of device layer 1302) using any suitable technique or techniques. In some embodiments, an oxide layer is formed on one or both of support substrate wafer 1701 and the backside surface of device layer 1302. In some embodiments, support substrate wafer 1701 and support substrate wafer 1201 are then brought into close proximity and bonded using van der Waals forces (e.g., at room temperature) and a subsequent anneal operation is performed to provide covalent bonding. Bonding layer 1702 may have any characteristics discussed herein with respect to bonding layer 105 although bonding layer 1702 is not yet patterned into regions 122, 123.

Figure 18:
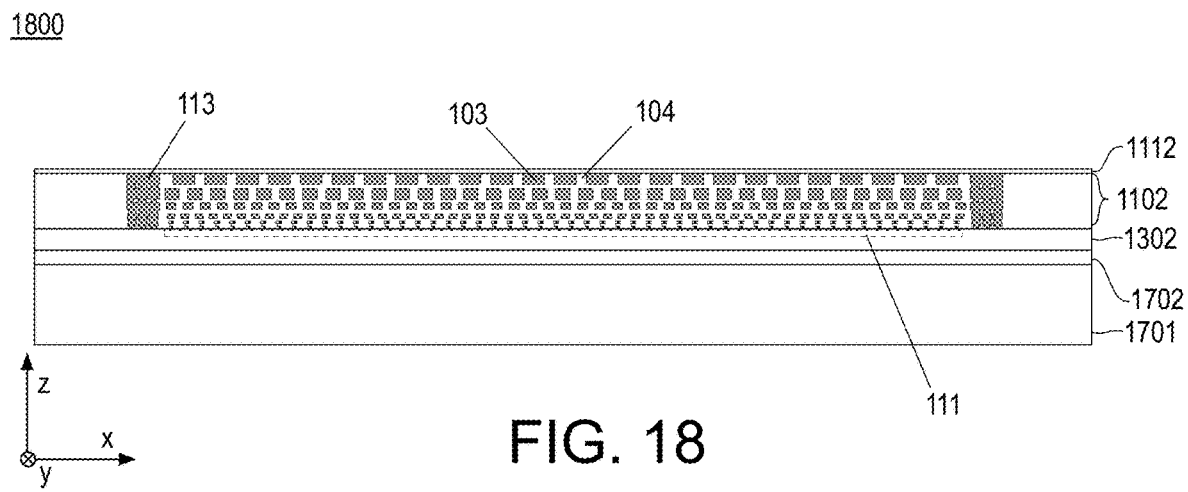

FIG. 18 illustrates an example device structure 1800, similar to device structure 1700, removal of sacrificial support substrate wafer 1201 and bonding layer 1202. Sacrificial support substrate wafer 1201 and bonding layer 1202 may be removed using any suitable technique or techniques. In some embodiments, bonding layer 1202 is releasable under UV light cure. However, any techniques may be used.

Notably, with reference to operation 1003 of FIG. 10, such processing forms a bonding layer (e.g., bonding layer 1702) between a support substrate wafer (e.g., support substrate wafer 1701) and device layer 1302. In this context, bonding layer 1702 is permanent (while bonding layer 1202 and support substrate wafer 1201 were temporary or sacrificial) and may have any characteristics discussed with respect to bonding layer 105 although bonding layer 1702 is not yet patterned into regions 122, 123.

Returning to FIG. 10, methods 1000 continue at operation 1004, where a trench is formed such that the trench laterally surrounds the semiconductor devices of the device layer and the metal interconnects of the interconnect layer and extends through the bonding layer, the interconnect layer, and the device layer to expose the support substrate wafer. The trench may be formed using any suitable technique or techniques. In some embodiments, patterning and etch techniques are employed. Furthermore, operation 1004 may be employed to pattern via openings for via structures as discussed herein.

In some embodiments, a patterned layer defining the trench and/or via openings is provided over the exposed one of the device layer or the passivation layer via spin on techniques followed by lithography techniques. The defined trench and/or via openings are then etched using multi-step etch techniques to define the trench and/or via openings.

Figure 14:
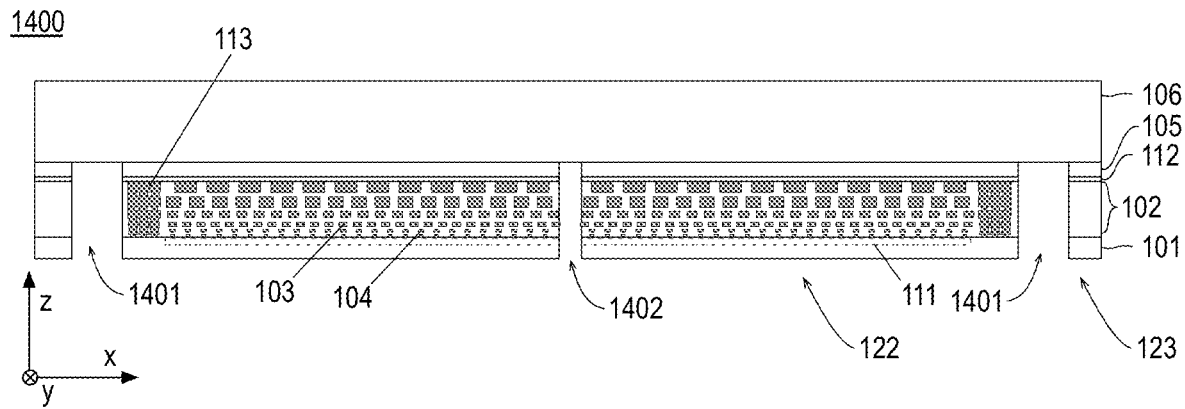

First, with reference to the fabrication flow that forms the permanent bonding layer adjacent the interconnect layer, FIG. 14 illustrates an example device structure 1400, similar to device structure 1300, after formation of a trench 1401 and a via opening 1402. Although illustrated with a single via opening 1402 for the sake of clarity of presentation, any number of via openings 1402 in any pattern may be implemented. Furthermore, in some embodiments, no via openings are used.

In some embodiments, trench 1401 and via opening 1402 are formed by providing a patterned layer (e.g., patterned resist) on device layer 101 such that the patterned layer matches the desired patterns of trench 1401 and a via opening 1402. Subsequently, etch operations are performed to remove, in turn, patterned portions of device layer 1302, interconnect layer 1102, passivation layer 1112, and bonding layer 1202 to provide device layer 101, interconnect layer 102, passivation layer 112, and bonding layer 105. In some embodiments, a subsequent etch may be performed to provide a recess or recesses in support substrate 106 such that subsequently guard ring and/or via structures may land within a portion of support substrate 106 as discussed with respect to FIG. 4.

Figure 19:
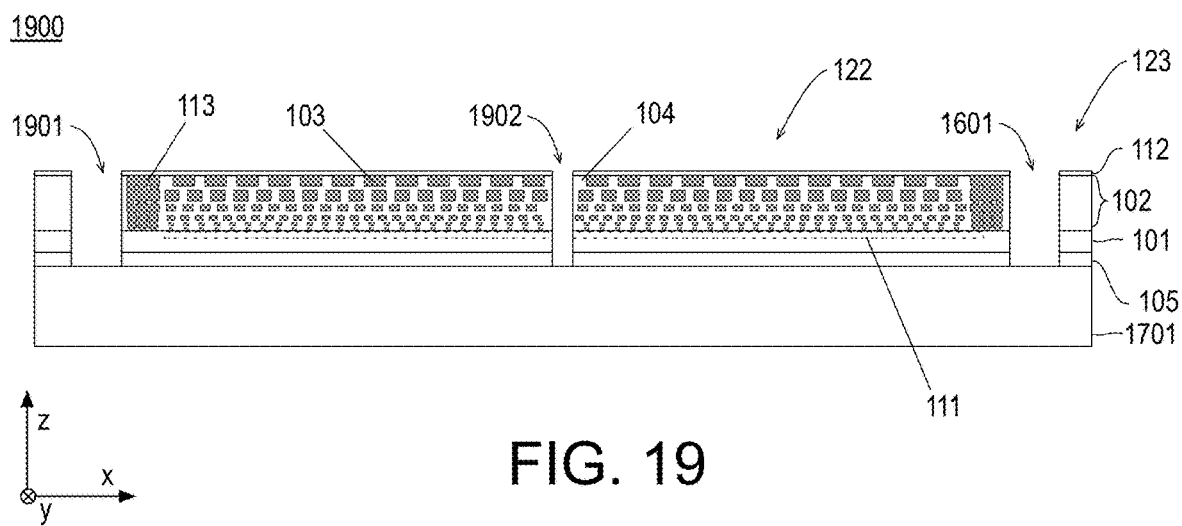

Turning now to the fabrication flow that forms the permanent bonding layer adjacent the device layer, FIG. 19 illustrates an example device structure 1900, similar to device structure 1800, after formation of a trench 1901 and a via opening 1902. As with device structure 1400, although illustrated with a single via opening 1902 for the sake of clarity of presentation, any number of via openings 1902 in any pattern may be implemented. In some embodiments, no via openings are used. Trench 1901 and/or via opening 1902 may be formed using any suitable technique or techniques such as providing a patterned layer on passivation layer 1112 such that the patterned layer matches the desired patterns of trench 1901 and a via opening 1902. Subsequently, etch operations are performed to remove, in turn, patterned portions of passivation layer 1112, interconnect layer 1102, device layer 1302, and bonding layer 1702 to provide passivation layer 112, interconnect layer 102, device layer 101, and bonding layer 105. In some embodiments, a subsequent etch may be performed to provide a recess or recesses in support substrate 1701 such that subsequently guard ring and/or via structures may land within a portion of support substrate 1701 as discussed with respect to FIG. 6.

Returning to FIG. 10, methods 1000 continue at operation 1005, where the trench formed at operation 1004 is filled with a guard ring structure to form a guard ring structure that surrounds the semiconductor devices of the device layer and the metal interconnects of the interconnect layer, extends through the bonding layer, the interconnect layer, and the device layer, and contacts the support substrate wafer. The guard ring structure may be formed using any suitable technique or techniques. Furthermore, operation 1005 may be employed to form via structures as discussed herein.

In some embodiments, formation of the guard ring structure and/or via structures includes forming, in turn, a liner layer (e.g., polymer liner), a barrier layer (e.g., a metal oxide), and a fill material, and subsequent planarization to remove excess material and provide the guard ring structure and/or via structures. In some embodiments, the liner layer is not employed and a barrier layer and fill layer are used. In some embodiments, only a fill material is used.

Figure 15:
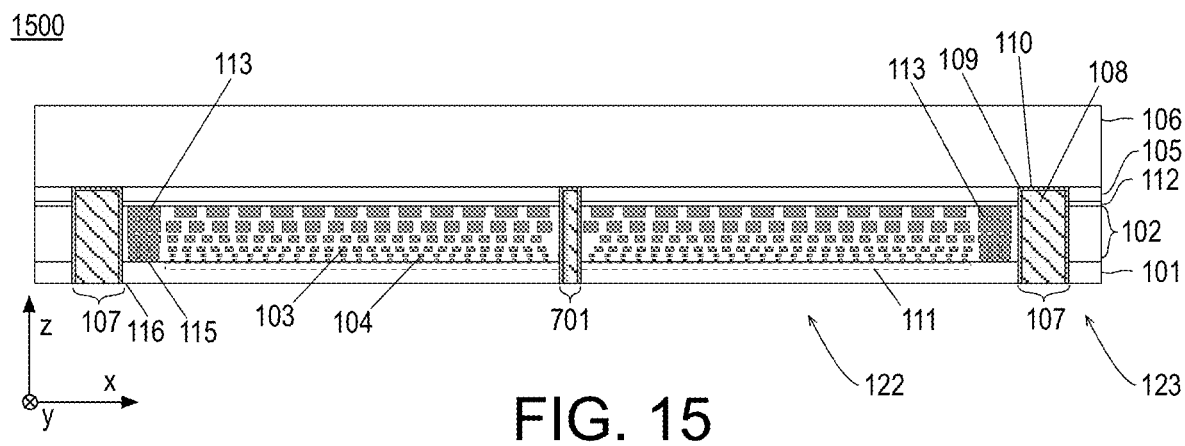

First, with reference to the fabrication flow that forms the permanent bonding layer adjacent the interconnect layer, FIG. 15 illustrates an example device structure 1500, similar to device structure 1400, after formation of guard ring structure 107 and via structure 701, which may have any characteristics discussed herein. Although illustrated with a single via structure 701 for the sake of clarity of presentation, any number of via structures 701 in any pattern may be implemented. Furthermore, in some embodiments, no via openings are used.

As discussed, guard ring structure 107 and via structure 701 may be formed by first providing a conformal liner layer (not shown in FIG. 15, please refer to FIG. 3) using conformal coating or deposition techniques. The conformal liner layer conforms to trench 1401 and/or via opening 1402 in a manner similar to that of barrier layer 109. In some embodiments, a portion of the liner layer at the bottoms of trench 1401 and via opening 1402 are removed. Barrier layer 109 is then formed using conformal deposition techniques such as atomic layer deposition (ALD). Subsequently fill material 108 is provided using bulk deposition techniques such as electroplating. Finally, portions of such materials on device layer 101 are removed using planarization techniques to provide device structure 1500. The liner layer, barrier layer 109, and fill material 108 may include any material discussed herein.

Figure 20:
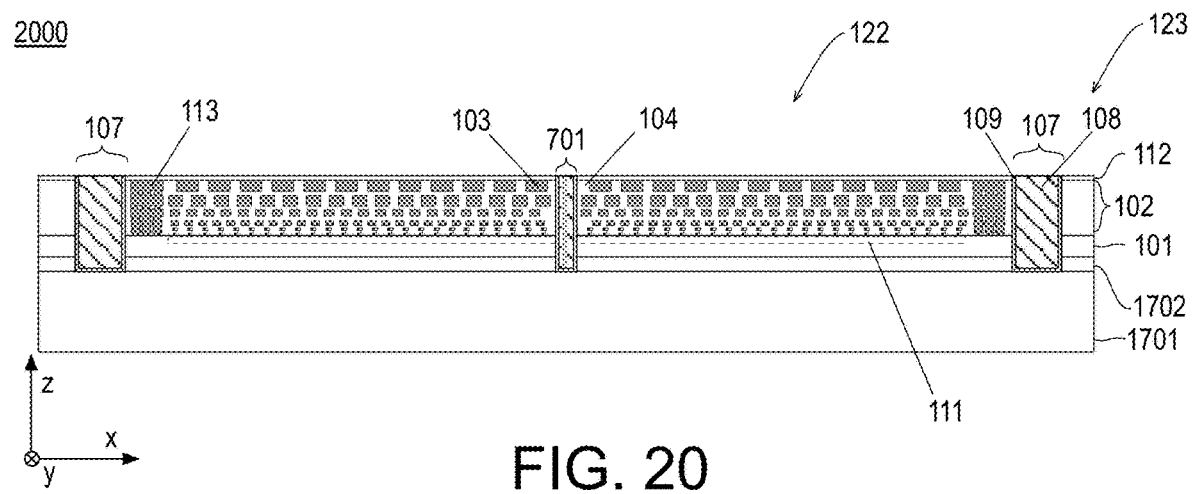

Turning now to the fabrication flow that forms the permanent bonding layer adjacent the device layer, FIG. 20 illustrates an example device structure 2000, similar to device structure 1900, after formation of guard ring structure 107 and via structure 701. Although illustrated with a single via structure 701 for the sake of clarity of presentation, any number of via structures 701 in any pattern may be implemented. Furthermore, in some embodiments, no via openings are used. As with device structure 1500, guard ring structure 107 and via structure 701 may be formed by first providing a conformal liner layer using conformal coating or deposition techniques, forming barrier layer 109 using conformal deposition techniques such as atomic layer deposition (ALD), and providing fill material 108 using bulk deposition techniques such as electroplating. Finally, portions of such materials on passivation layer 112 are removed using planarization techniques to provide device structure 2000.

Returning to FIG. 10, methods 1000 continue at operation 1006, where package level interconnects are formed over the device layer or the passivation layer, the wafer is diced to provide individual dies, each die is packaged, and thermal solutions are applied. For example, the package level interconnects are to interconnect each die to a corresponding package substrate. Such package level interconnects may be formed using any suitable technique or techniques such as metal deposition and patterning techniques, selective metallization of exposed bond pads, and so on. The wafer is then diced to provide individual dies, each having a guard ring structure as described herein.

Each resultant die may then be packaged via attachment to a package substrate such as an organic printed circuit board, to an interposer, to a motherboard, or the like. In each example the package level interconnects may be formed opposite the support substrate and attachment is made opposite the support substrate. Subsequently, a heat exchanger is coupled to the support substrate. The heat exchanger may include any thermal solution such as a thermal interface material, an integrated heat spreader, a heat sink, or combinations thereof. As discussed, in some embodiments, the guard ring structure provides heat transfer from the device layer to the heat exchanger. In addition, via structures, if applicable may provide heat transfer from the device layer to the heat exchanger. Furthermore, one or both of the guard ring structure and the via structures may be attached to a ground plane to ground the device layer. Other uses of the guard ring structure and/or the via structures in the final package may be used.

Figure 16:
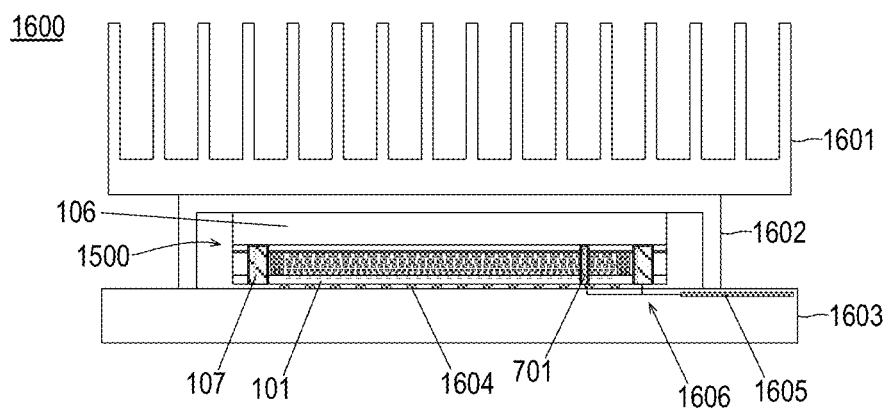

First, with reference to the fabrication flow that forms the permanent bonding layer adjacent the interconnect layer, FIG. 16 illustrates an example device structure 1600, similar to device structure 1500, after formation of package interconnects 1604, bonding to a package substrate 1603, application of an integrated heat spreader 1602 over device structure 1500, and attachment of a heat sink 1601 over integrated heat spreader 1602. As shown, of package interconnects 1604 are formed on or over device layer 101 and device layer 101 is adjacent package substrate 1603. In some embodiments, one or both of via structure 701 and guard ring structure 107 are coupled to a ground plane 1605 via electrical trace(s) 1606. Although illustrated with respect to a thermal solution including integrated heat spreader 1602 and heat sink 1601 as heat exchangers, any heat exchanger devices or materials may be employed to remove heat. Notably, via structure 701 and/or guard ring structure 107 provide a heat removal route from device layer 101 to support substrate 106 and, ultimately, the heat exchanger.

Although illustrated with respect to bonding of a single die to a package substrate 1603, device structure 1500 (optionally inclusive of package interconnects 1604) may be provided in any package such as multi-chip packages.

Figure 21:
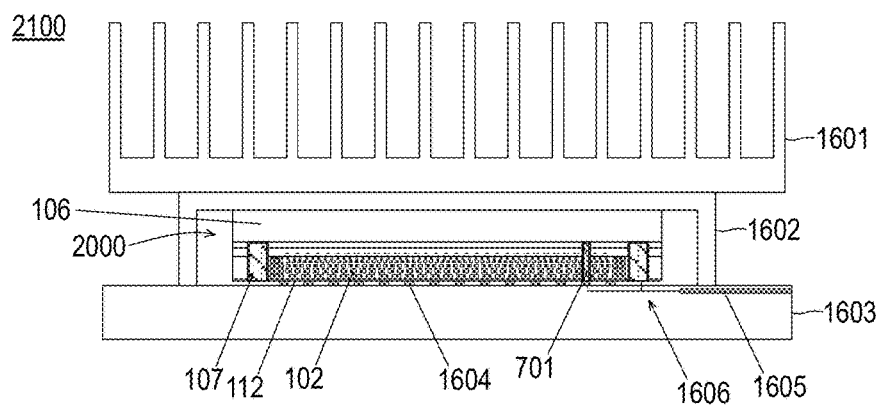

Turning now to the fabrication flow that forms the permanent bonding layer adjacent the device layer, FIG. 21 illustrates an example device structure 2100, similar to device structure 2000, after formation of package interconnects 1604, bonding to package substrate 1603, application of integrated heat spreader 1602 over device structure 2000, and attachment of heat sink 1601 over integrated heat spreader 1602. As shown, in this context, package interconnects 1604 are formed on or over passivation layer 112 and interconnect layer 102, which are adjacent package substrate 1603. As shown, in some embodiments, one or both of via structure 701 and guard ring structure 107 are coupled to ground plane 1605 via electrical trace(s) 1606. Although illustrated with respect to a thermal solution including integrated heat spreader 1602 and heat sink 1601 as heat exchangers, any heat exchanger devices or materials may be employed to remove heat in the context of device structure 2100.

Although illustrated with respect to bonding of a single die to a package substrate 1603, device structure 1500 (optionally inclusive of package interconnects 1604) may be provided in any package such as multi-chip packages.

Figure 22:
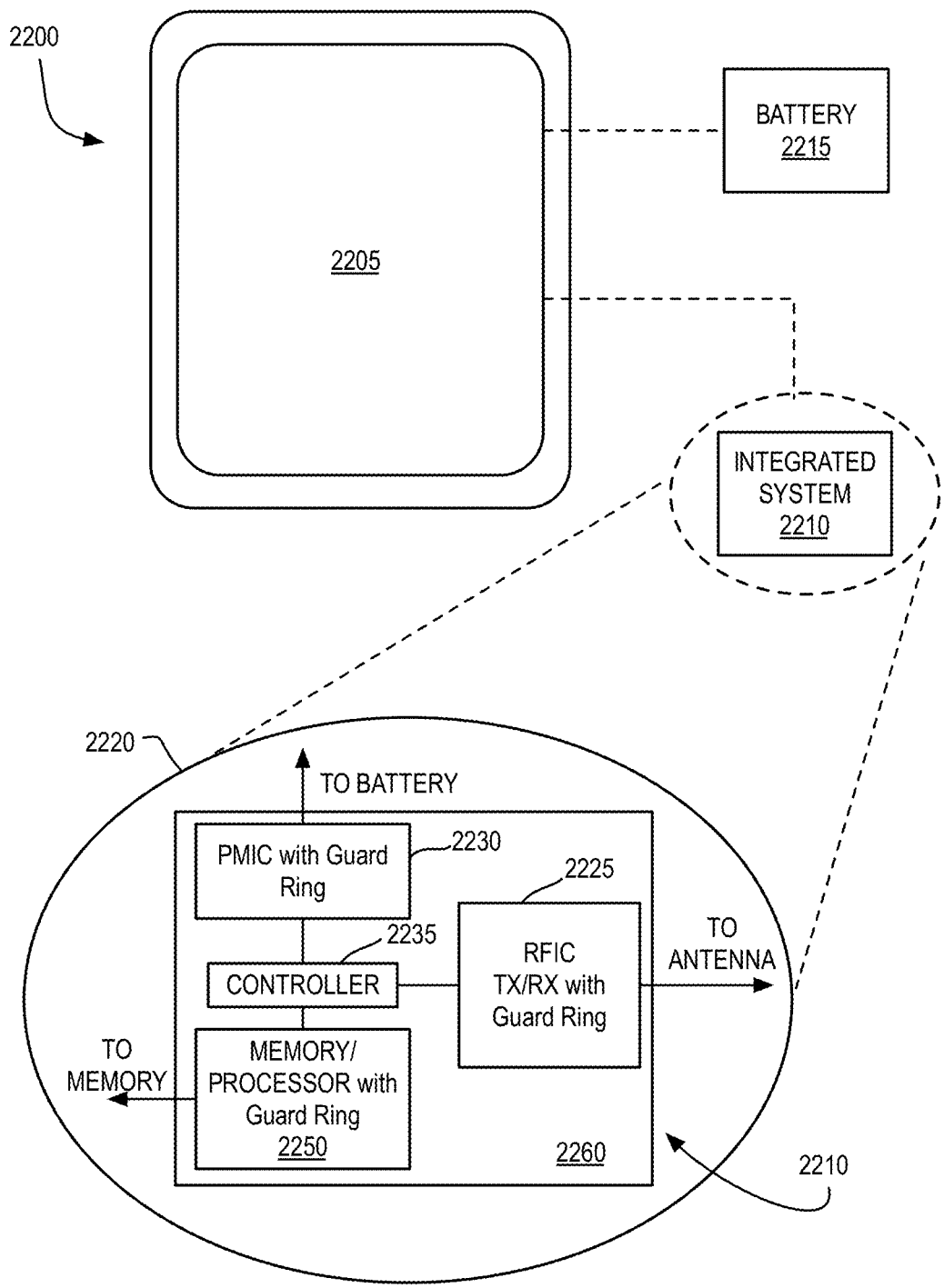
FIG. 22 is an illustrative diagram of a mobile computing platform employing a device having a hermetic guard ring structure.

FIG. 22 is an illustrative diagram of a mobile computing platform 2200 employing a device having a hermetic guard ring structure, arranged in accordance with at least some implementations of the present disclosure. Any die or device having any hermetic guard ring structure and/or via structures and/or related characteristics discussed herein may be implemented by any component of mobile computing platform 2200. Mobile computing platform 2200 may be any portable device configured for each of electronic data display, electronic data processing, wireless electronic data transmission, or the like. For example, mobile computing platform 2200 may be any of a tablet, a smart phone, a netbook, a laptop computer, etc. and may include a display screen 2205, which in the exemplary embodiment is a touchscreen (e.g., capacitive, inductive, resistive, etc. touchscreen), a chip-level (SoC) or package-level integrated system 2210, and a battery 2215. Battery 2215 may include any suitable device for providing electrical power such as a device consisting of one or more electrochemical cells and electrodes to couple to an outside device.

Integrated system 2210 is further illustrated in the expanded view 2220. In the exemplary embodiment, packaged device 2250 (labeled "Memory/Processor" in FIG. 22) includes at least one memory chip (e.g., RAM), and/or at least one processor chip (e.g., a microprocessor, a multi-core microprocessor, or graphics processor, or the like). In an embodiment, the package device 2250 is a microprocessor including an SRAM cache memory. As shown, device 2250 may employ a die or device having any hermetic guard ring structure and/or via structures and/or related characteristics discussed herein. Packaged device 2250 may be further coupled to (e.g., communicatively coupled to) a board, a substrate, or an interposer 2260 along with, one or more of a power management integrated circuit (PMIC) 2230, RF (wireless) integrated circuit (RFIC) 2225 including a wideband RF (wireless) transmitter and/or receiver (TX/RX) (e.g., including a digital baseband and an analog front end module further comprises a power amplifier on a transmit path and a low noise amplifier on a receive path), and a controller thereof 2235. In general, packaged device 2250 may also be coupled to (e.g., communicatively coupled to) display screen 2205. As shown, one or both of PMIC 2230 and RFIC 2225 may employ a die or device having any hermetic guard ring structure and/or via structures and/or related characteristics discussed herein.

Functionally, PMIC 2230 may perform battery power regulation, DC-to-DC conversion, etc., and so has an input coupled to battery 2215 and with an output providing a current supply to other functional modules. In an embodiment, PMIC 2230 may perform high voltage operations. As further illustrated, in the exemplary embodiment, RFIC 2225 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 2250 or within a single IC (SoC) coupled to the package substrate of the packaged device 2250.

Figure 23:
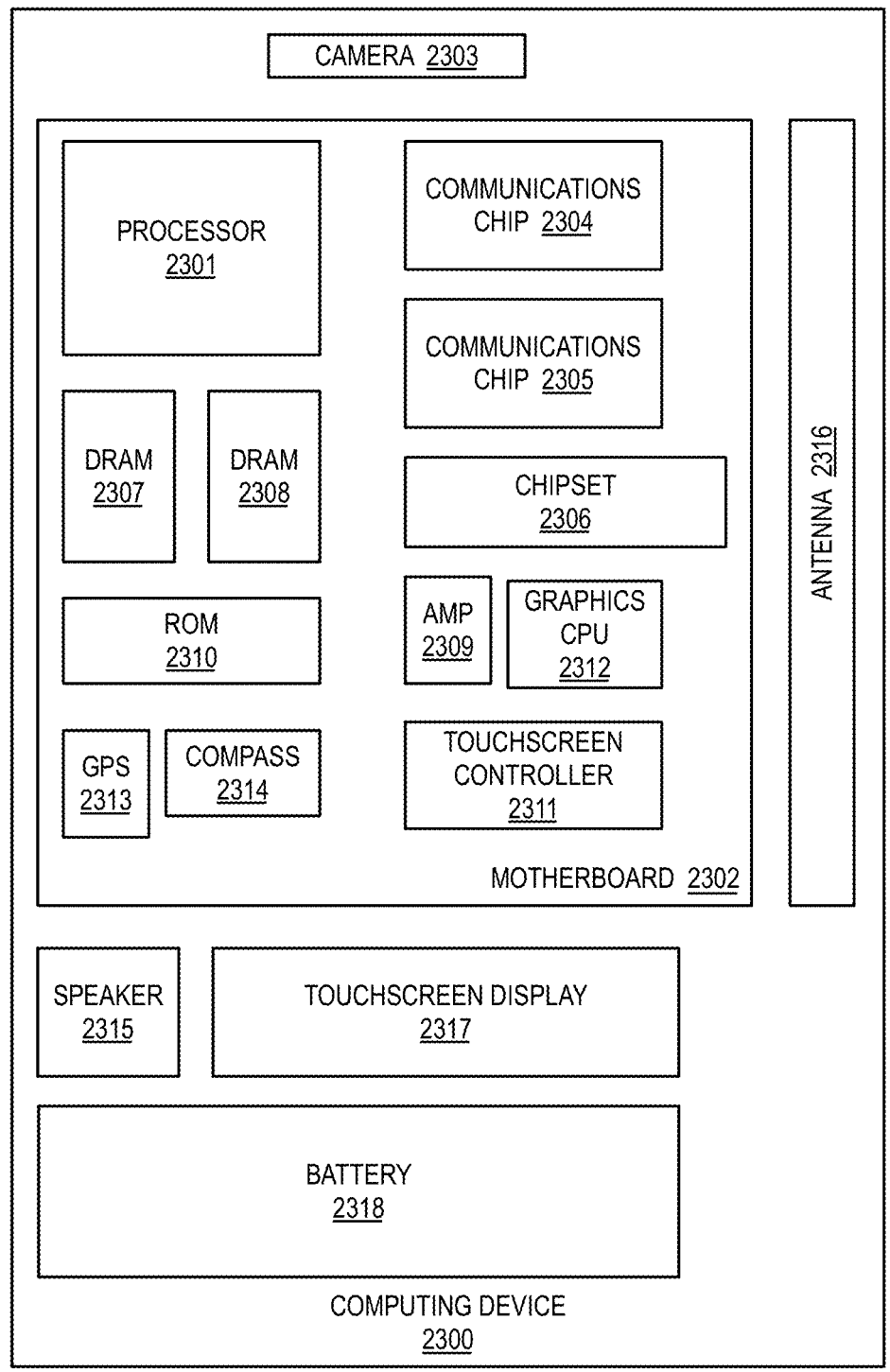
FIG. 23 is a functional block diagram of a computing device, all arranged in accordance with at least some implementations of the present disclosure.

FIG. 23 is a functional block diagram of a computing device 2300, arranged in accordance with at least some implementations of the present disclosure. Computing device 2300 may be found inside platform 2200, for example, and further includes a motherboard 2302 hosting a number of components, such as but not limited to a processor 2301 (e.g., an applications processor) and one or more communications chips 2304, 2305. Processor 2301 may be physically and/or electrically coupled to motherboard 2302. In some examples, processor 2301 includes an integrated circuit die packaged within the processor 2301. In general, the term "processor" may refer to any device or portion of a device that processes electronic data from registers and/or memory to transform that electronic data into other electronic data that may be stored in registers and/or memory. Any one or more device or component of computing device 2300 may include a die or device having any hermetic guard ring structure and/or via structures and/or related characteristics discussed herein as discussed herein.

In various examples, one or more communication chips 2304, 2305 may also be physically and/or electrically coupled to the motherboard 2302. In further implementations, communication chips 2304 may be part of processor 2301. Depending on its applications, computing device 2300 may include other components that may or may not be physically and electrically coupled to motherboard 2302. These other components may include, but are not limited to, volatile memory (e.g., DRAM) 2307, 2308, non-volatile memory (e.g., ROM) 2310, a graphics processor 2312, flash memory, global positioning system (GPS) device 2313, compass 2314, a chipset 2306, an antenna 2316, a power amplifier 2309, a touchscreen controller 2311, a touchscreen display 2317, a speaker 2315, a camera 2303, and a battery 2318, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 2304, 2305 may enables wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2304, 2305 may implement any of a number of wireless standards or protocols, including but not limited to those described elsewhere herein. As discussed, computing device 2300 may include a plurality of communication chips 2304, 2305. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, a device comprising a device layer adjacent to an interconnect layer, the device layer comprising a plurality of semiconductor devices and the interconnect layer comprising a plurality of metal interconnects, a bonding layer on a support substrate and adjacent one of the interconnect layer or the device layer, and a guard ring structure, wherein the guard ring structure laterally surrounds the semiconductor devices and the metal interconnects, extends through the bonding layer, the interconnect layer, and the device layer, and is in contact with the support substrate.

In one or more second embodiments, further to the first embodiments, the device further comprises a second guard ring structure within the interconnect layer, wherein the second guard ring structure surrounds the metal interconnects and extends from a first surface of the interconnect layer and terminates at a first surface of the device layer, wherein the guard ring structure extends through the first surface of the interconnect layer, the first surface of the device layer, and a second surface of the device layer opposite the first surface of the device layer.

In one or more third embodiments, further to the first or second embodiments, the bonding layer is on a first surface of the support substrate and the guard ring structure extends not less than 200 nm beyond the first surface into support substrate.

In one or more fourth embodiments, further to any of the first through third embodiments, the bonding layer is adjacent the interconnect layer and the device further comprises a plurality of via structures within a perimeter of the guard ring structure, wherein each of the via structures extends through the bonding layer, the interconnect layer, and the device layer, and is in contact with the support substrate.

In one or more fifth embodiments, further to any of the first through fourth embodiments, at least one of the plurality of via structures is to couple to a ground plane.

In one or more sixth embodiments, further to any of the first through fifth embodiments, the guard ring structure comprises a barrier layer and a fill material within the barrier layer, the barrier layer comprising a metal and oxygen and the fill material comprising copper.

In one or more seventh embodiments, further to any of the first through sixth embodiments, the guard ring structure further comprises a polymer liner, wherein the barrier layer is within the polymer liner.

In one or more eighth embodiments, further to any of the first through seventh embodiments, the support substrate and the device layer comprise silicon and the bonding layer comprises silicon and oxygen.

In one or more ninth embodiments, further to any of the first through eighth embodiments, the guard ring structure comprises a lateral width between sidewalls thereof of not less than 4 microns.

In one or more tenth embodiments, further to any of the first through ninth embodiments, the guard ring structure defines a substantially rectangular or square perimeter around the semiconductor devices and the metal interconnects.

In one or more eleventh embodiments, further to any of the first through tenth embodiments, the guard ring structure is laterally surrounded by outer edges of the device layer, the interconnect layer, the bonding layer, and the support substrate.

In one or more twelfth embodiments, a system comprises an interconnect layer on a device layer, the device layer comprising a plurality of semiconductor devices and the interconnect layer comprising a plurality of metal interconnects, a bonding layer immediately between a support substrate and one of the interconnect layer or the device layer, a guard ring structure, wherein the guard ring structure laterally surrounds the semiconductor devices and the metal interconnects, extends through the bonding layer, the interconnect layer, and the device layer, and is in contact with the support substrate, and a heat exchanger thermally coupled to the support substrate.

In one or more thirteenth embodiments, further to the twelfth embodiments, the system further comprises a second guard ring structure within the interconnect layer, wherein the second guard ring structure surrounds the metal interconnects and extends from a first surface of the interconnect layer and terminates at a first surface of the device layer, wherein the guard ring structure extends through the first surface of the interconnect layer, the first surface of the device layer, and a second surface of the device layer opposite the first surface of the device layer.

In one or more fourteenth embodiments, further to the twelfth or thirteenth embodiments, the system further comprises a plurality of package interconnects opposite the support substrate with respect to the device layer and the interconnect layer and a package substrate coupled to the package interconnects.

In one or more fifteenth embodiments, further to any of the twelfth through fourteenth embodiments, the bonding layer is adjacent the interconnect layer and the system further comprises a plurality of via structures within a perimeter of the guard ring structure, wherein each of the via structures extends through the bonding layer, the interconnect layer, and the device layer, and is in contact with the support substrate.

In one or more sixteenth embodiments, further to any of the twelfth through fifteenth embodiments, at least one of the plurality of via structures is coupled to a ground plane.

In one or more seventeenth embodiments, further to any of the twelfth through sixteenth embodiments, the bonding layer is on a first surface of the support substrate and the guard ring structure extends not less than 200 nm beyond the first surface into support substrate.

In one or more eighteenth embodiments, further to any of the twelfth through seventeenth embodiments, the guard ring structure comprises a barrier layer and a fill material within the barrier layer, the barrier layer comprising a metal and oxygen and the fill material comprising copper.

In one or more nineteenth embodiments, further to any of the twelfth through eighteenth embodiments, the guard ring structure further comprises a polymer liner, wherein the barrier layer is within the polymer liner.

In one or more twentieth embodiments, further to any of the twelfth through nineteenth embodiments, the support substrate and the device layer comprise silicon and the bonding layer comprises silicon and oxygen.

In one or more twenty-first embodiments, further to any of the twelfth through twentieth embodiments, the guard ring structure comprises a lateral width between sidewalls thereof of not less than 4 microns.

In one or more twenty-second embodiments, further to any of the twelfth through twenty-first embodiments, the guard ring structure defines a substantially rectangular or square perimeter around the semiconductor devices and the metal interconnects.

In one or more twenty-third embodiments, further to any of the twelfth through twenty-second embodiments, the guard ring structure is laterally surrounded by outer edges of the device layer, the interconnect layer, the bonding layer, and the support substrate.

In one or more twenty-fourth embodiments, a method of fabricating a device comprises disposing an interconnect layer over a device layer, the device layer comprising a plurality of semiconductor devices and the interconnect layer comprising a plurality of metal interconnects, forming a bonding layer on a support substrate and adjacent one of the device layer or the interconnect layer, forming a trench, wherein the trench laterally surrounds the semiconductor devices and the metal interconnects, extends through the bonding layer, the interconnect layer, and the device layer, and exposes the support substrate, and filling the trench with a guard ring structure.

In one or more twenty-fifth embodiments, further to the twenty-fourth embodiments, the bonding layer is adjacent the interconnect layer and the method further comprises removing a sacrificial portion of a substrate comprising the device layer and the sacrificial portion to form the device layer.

In one or more twenty-sixth embodiments, further to the twenty-fourth or twenty-fifth embodiments, the bonding layer is adjacent the device layer the method further comprises bonding a second support substrate to the interconnect layer, removing a sacrificial portion of a bulk substrate comprising the device layer and the sacrificial portion to form the device layer, and separating the second support substrate from the interconnect layer.

In one or more twenty-seventh embodiments, further to any of the twenty-fourth through twenty-sixth embodiments, forming the trench further comprises forming an opening within a perimeter defined by the trench, wherein the opening extends through the bonding layer, the interconnect layer, and the device layer, and exposes the support substrate, the method further comprising filling the trench with a via structure simultaneously with said filling the trench with the guard ring structure.

In one or more twenty-eighth embodiments, further to any of the twenty-fourth through twenty-seventh embodiments, the method further comprises forming a second guard ring structure within the interconnect layer, wherein the second guard ring structure surrounds the metal interconnects and extends from a first surface of the interconnect layer and terminates at a first surface of the device layer, wherein the guard ring structure extends through the first surface of the interconnect layer, the first surface of the device layer, and a second surface of the device layer opposite the first surface of the device layer.

In one or more twenty-ninth embodiments, further to any of the twenty-fourth through twenty-eighth embodiments, wherein the bonding layer is on a first surface of the support substrate and the guard ring structure extends not less than 200 nm beyond the first surface into support substrate.

In one or more thirtieth embodiments, further to any of the twenty-fourth through twenty-ninth embodiments, at least one of the plurality of via structures is to couple to a ground plane.

In one or more thirty-first embodiments, further to any of the twenty-fourth through thirtieth embodiments, the guard ring structure comprises a barrier layer and a fill material within the barrier layer, the barrier layer comprising a metal and oxygen and the fill material comprising copper.

In one or more thirty-second embodiments, further to any of the twenty-fourth through thirty-first embodiments, the guard ring structure further comprises a polymer liner, wherein the barrier layer is within the polymer liner.

In one or more thirty-third embodiments, further to any of the twenty-fourth through thirty-second embodiments, the support substrate and the device layer comprise silicon and the bonding layer comprises silicon and oxygen.

In one or more thirty-fourth embodiments, further to any of the twenty-fourth through thirty-third embodiments, the guard ring structure comprises a lateral width between sidewalls thereof of not less than 4 microns.

In one or more thirty-fifth embodiments, further to any of the twenty-fourth through thirty-fourth embodiments, the guard ring structure defines a substantially rectangular or square perimeter around the semiconductor devices and the metal interconnects.

In one or more thirty-sixth embodiments, further to any of the twenty-fourth through thirty-fifth embodiments, the guard ring structure is laterally surrounded by outer edges of the device layer, the interconnect layer, the bonding layer, and the support substrate.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A device comprising:
a device layer adjacent to an interconnect layer, the device layer comprising a plurality of semiconductor devices and the interconnect layer comprising a plurality of metal interconnects;
a bonding layer on a support substrate and adjacent one of the interconnect layer or the device layer; and
a guard ring structure, wherein the guard ring structure laterally surrounds the semiconductor devices and the metal interconnects, extends through the bonding layer, the interconnect layer, and the device layer, and is in contact with the support substrate.

2. The device of claim 1, further comprising:
a second guard ring structure within the interconnect layer, wherein the second guard ring structure surrounds the metal interconnects and extends from a first surface of the interconnect layer and terminates at a first surface of the device layer, wherein the guard ring structure extends through the first surface of the interconnect layer, the first surface of the device layer, and a second surface of the device layer opposite the first surface of the device layer.

3. The device of claim 1, wherein the bonding layer is on a first surface of the support substrate and the guard ring structure extends not less than 200 nm beyond the first surface into support substrate.

4. The device of claim 1, wherein the bonding layer is adjacent the interconnect layer, the device further comprising:
a plurality of via structures within a perimeter of the guard ring structure, wherein each of the via structures extends through the bonding layer, the interconnect layer, and the device layer, and is in contact with the support substrate.

5. The device of claim 4, wherein at least one of the plurality of via structures is to couple to a ground plane.

6. The device of claim 1, wherein the guard ring structure comprises a barrier layer and a fill material within the barrier layer, the barrier layer comprising a metal and oxygen and the fill material comprising copper.

7. The device of claim 6, wherein the guard ring structure further comprises a polymer liner, wherein the barrier layer is within the polymer liner.

8. The device of claim 1, wherein the support substrate and the device layer comprise silicon and the bonding layer comprises silicon and oxygen.

9. The device of claim 1, wherein the guard ring structure comprises a lateral width between sidewalls thereof of not less than 4 microns.

10. The device of claim 9, wherein the guard ring structure defines a substantially rectangular or square perimeter around the semiconductor devices and the metal interconnects.

11. The device of claim 1, wherein the guard ring structure is laterally surrounded by outer edges of the device layer, the interconnect layer, the bonding layer, and the support substrate.

12. The device is claim 1, further comprising:
a heat exchanger thermally coupled to the support substrate.

* * * * *